United States Patent [19]
Lesmeister

[11] Patent Number: 5,696,772
[45] Date of Patent: Dec. 9, 1997

[54] TEST VECTOR COMPRESSION/ DECOMPRESSION SYSTEM FOR PARALLEL PROCESSING INTEGRATED CIRCUIT TESTER

[75] Inventor: Gary J. Lesmeister, Hayward, Calif.

[73] Assignee: Credence Systems Corporation, Fremont, Calif.

[21] Appl. No.: 496,220

[22] Filed: Jun. 28, 1995

Related U.S. Application Data

[63] Continuation-in-part of Ser. No. 239,298, May 6, 1994, abandoned.

[51] Int. Cl.$^6$ .................. G01R 31/3183; G06F 11/263; G06F 11/273
[52] U.S. Cl. .................. 371/27; 324/73.1; 364/579; 364/580; 395/183.08
[58] Field of Search ............... 324/73.1; 364/579, 364/580; 371/27; 395/183.08

[56] References Cited

U.S. PATENT DOCUMENTS

| | | | |
|---|---|---|---|
| 3,931,506 | 1/1976 | Borrelli et al. | 324/73.1 X |
| 4,070,565 | 1/1978 | Borrelli | 364/580 X |
| 4,293,950 | 10/1981 | Shimizu et al. | 371/27 |
| 4,354,268 | 10/1982 | Michel et al. | 324/73.1 X |
| 4,397,021 | 8/1983 | Lloyd et al. | 395/183.08 |
| 4,402,055 | 8/1983 | Lloyd et al. | 364/579 |
| 4,439,858 | 3/1984 | Petersen | 371/27 X |
| 4,637,020 | 1/1987 | Schinabeck | 364/579 X |
| 4,806,852 | 2/1989 | Swan et al. | 324/73.1 |
| 4,807,229 | 2/1989 | Tada | 371/27 |
| 4,813,043 | 3/1989 | Maeno et al. | 371/27 |
| 4,862,067 | 8/1989 | Brune et al. | 324/73.1 |
| 4,862,460 | 8/1989 | Yamaguchi | 371/27 |
| 4,931,723 | 6/1990 | Jeffrey et al. | 324/73.1 X |
| 4,994,732 | 2/1991 | Jeffrey et al. | 324/73.1 |
| 5,499,248 | 3/1996 | Behrens et al. | 371/27 X |
| 5,574,733 | 11/1996 | Kim | 371/27 |
| 5,629,946 | 5/1997 | Takano | 371/27 |

*Primary Examiner*—Edward R. Cosimano
*Attorney, Agent, or Firm*—Smith-Hill and Bedell

[57] ABSTRACT

An integrated circuit (IC) tester includes several processing nodes, each accessing a separate terminal of an IC to be tested. The tester receives as input a description of an integrated circuit test to be conducted. The description indicates actions to be taken at each processing node and a time relative to the start of the test that each action is to be taken. The actions may include transmitting a test signal to the IC or sampling an output signal produced by the IC. Before starting the test, the tester converts the description into a set of algorithms for generating test vectors and stores each algorithm in a separate processing node. The test is organized into a succession of test cycles and during the test, each node executes its stored algorithm, generating a separate test vector at the beginning of each test cycle. The test vector indicates an action to be taken by that node during the following test cycle along with a time during the test cycle that the action is to be taken. Each node includes circuits for executing the action at the time indicated.

10 Claims, 24 Drawing Sheets

TEST VECTOR COMPRESSION/ DECOMPRESSION SYSTEM FOR PARALLEL PROCESSING INTEGRATED CIRCUIT TESTER

CROSS-REFERENCE TO RELATED APPLICATIONS

The present application is a continuation in part of application Ser. No. 08/239,298, filed May 6, 1994, now abandoned.

BACKGROUND OF THE INVENTION

1. Field of the Invention

The present invention relates in general to integrated circuit testers and in particular to a tester that compresses and decompresses algorithmic instructions for generating test vectors.

2. Description of Related Art

To test an integrated circuit or similar device under test (DUT), a typical integrated circuit tester transmits test signal pulses to various terminals of the DUT and samples output signals generated at those terminals by the DUT in response to the test signals. The acquired samples may then be analyzed to determine whether the DUT is responding as expected to the test signals.

An integrated circuit tester includes a set of modules or "nodes", one node being associated with each terminal of the DUT. A test is organized into a set of successive time segments ("test cycles"). During any given test cycle, each node can either transmit a test signal to the associated terminal, sample a DUT output signal at the associated terminal, or do neither. Each node includes its own memory for storing a sequence of commands ("test vectors"). Each test vector indicates an action to be taken by the node during a test cycle—e.g. whether it is to start or stop transmitting, start or stop acquiring. Each node also includes circuits for sequentially reading the test vectors out of memory during successive test cycles and performing the indicated actions.

The nodes are interconnected to a host computer via a bus network. Before a test begins, the host computer executes an algorithm for generating the test vectors to be stored in the node memories. The host computer then transmits the generated test vectors to the nodes for storage in their memories. Thereafter a clock signal transmitted to all of the nodes synchronizes the nodes so that they all read the test vectors out of memory and perform the indicated actions in unison.

Generally a tester stores one test vector for all nodes in memory for each test cycle. In recent years the size and complexity of integrated circuits have increased dramatically and so too has the length of the test vector sequences needed to fully test these circuits. It is not unusual for tests to run many millions of cycles and therefore require test vector sequences having many millions of elements. As storage requirements increase they exceed the size of memory that can be practically or economically installed at each node. Thus long tests are performed in segments with tester operation suspended between each segment while the test vectors for the next segment are loaded into the node memories. This greatly extends the total time and costs required for a test.

Before fabricating an IC, an integrated circuit designer usually tests an IC design using a computer-based integrated circuit simulator. In order to compare test results of the simulated IC with the test results of the actual IC, designers would like to be able to run the same test procedures on the simulated and actual IC's using the same test description as input to both the IC simulator and the IC tester. However there is a problem in doing so. Instructions for IC simulators are often written in a hardward description language (HDL), for example, the Verilog hardware description language interface, a pending IEEE standard language widely used by electronic hardware designers to design integrated circuits. One could develop a program to generate test vectors from the HDL code and then store the test vectors in the tester memory prior to the start of an IC test. But as discussed above, tester memory is often not large enough or of the right nature to store the test vectors that would be generated. Therefore, to account for the limitations of the IC tester, test engineers must manually develop IC tests which differ from the simulator tests. This manual intensive extra effort is expensive and time consuming and the difference in test procedures makes it difficult for designers to compare simulator and tester results.

What is needed is an integrated circuit tester which can perform a long, high speed integrated circuit test using a hardware description language input similar to those used to describe IC simulator tests.

SUMMARY OF THE INVENTION

In accordance with one aspect of the invention, an integrated circuit tester transmits test signals to selected terminals of a device under test (DUT) and acquires data produced by the DUT at others of its terminals during a succession of test cycles. The tester includes several processing nodes, one node associated with each terminal of the DUT. Each node includes a memory for storing algorithmic instructions for generating a sequence of test vectors. Each successive test vector includes data indicating an action to be taken during a next successive test cycle, such as asserting or deasserting the test signal or beginning or ending acquisition of DUT output data. Each test vector also includes timing data indicating a time during the next test cycle when the action is to be taken. Each node also includes circuits for processing the algorithmic instructions to produce the test vectors and circuits responsive to the test vectors for providing the test signal generation and data acquisition indicated by the test vectors. For tests involving long sequences of test vectors, the amount of memory needed to store algorithmic instructions for generating the test vector sequences is much smaller than the amount of memory needed to store the test vector sequences themselves.

In accordance with another aspect of the invention, the tester includes a host computer for receiving as input a hardware description language (HDL) description of an integrated circuit test suitable for use in an IC simulator. The host computer converts the HDL description into sets of algorithmic instructions, and stores the instructions in the node memories prior to commencement of the test. Thus the tester is programmed using the same HDL description as may be used to program an IC simulator to carry out a test.

It is accordingly an object of the invention to provide an integrated circuit tester which performs a long integrated circuit test seamlessly without need for large node memories and without having to periodically halt the test to reload the node memories.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING (S)

DESCRIPTION OF THE PREFERRED EMBODIMENT(S)

Figure 1:
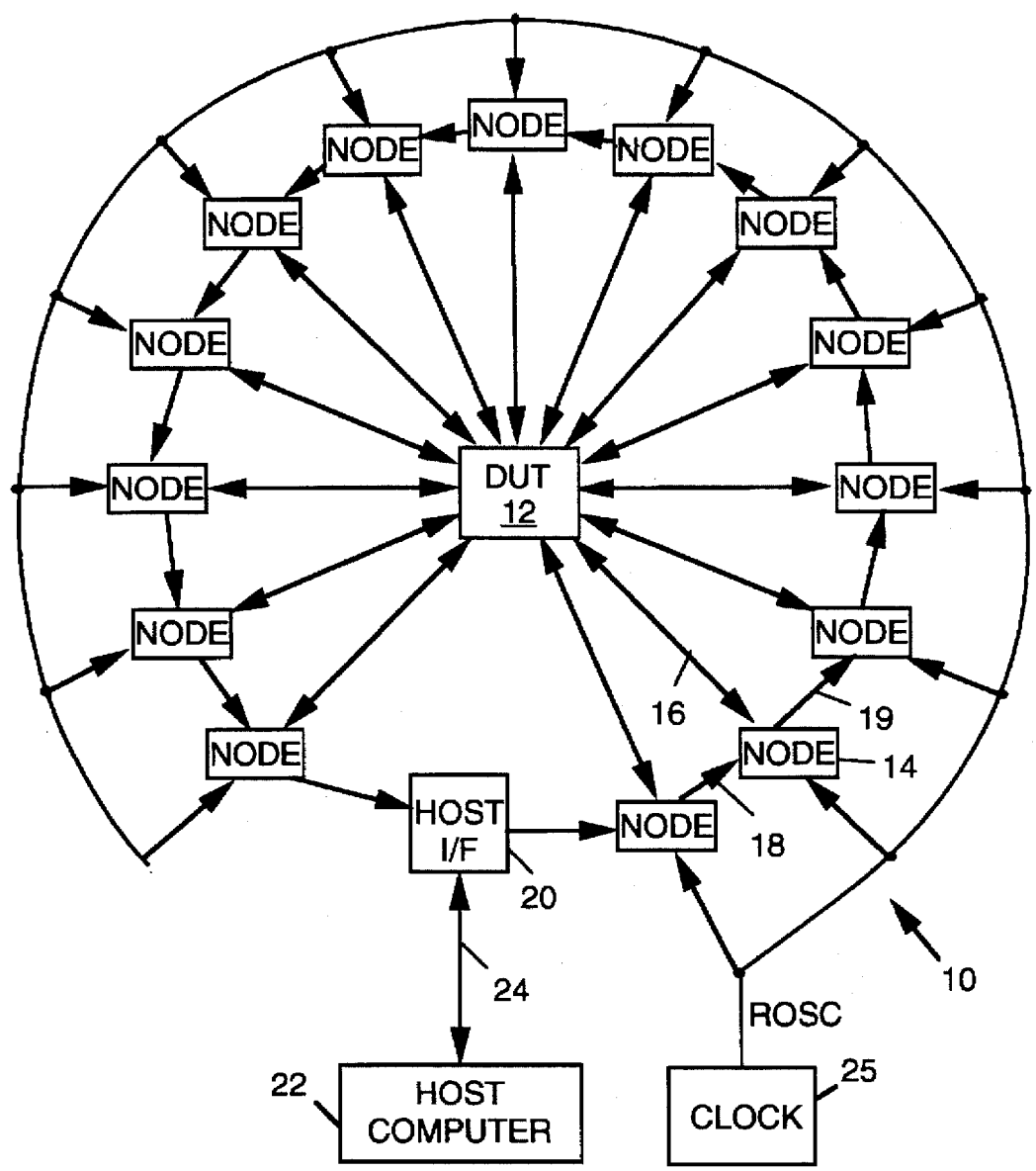
FIG. 1 is a block diagram of a parallel processing integrated circuit tester in accordance with the present invention.

FIG. 1 is a block diagram of a tester 10 in accordance with the present invention for testing an integrated circuit (IC) or other device under test (DUT) 12. DUT 12 has a set of pins, pads or other type of access terminals for input and output signals. Tester 10 includes several processing nodes 14. During a test, each node 14 may transmit a test signal to a separate DUT terminal via a conductor 16 or may sample an output signal produced by the DUT on conductor 16. For simplicity FIG. 1 shows only a few nodes 14 but the tester 10 may include a much larger quantity of nodes 14.

A test is partitioned into a very large number of short test cycles of similar duration. At precisely determined times during each of a succession of test cycles each node 14 may carry out one or more actions in response to a sequence of commands ("test vectors"). Each successive test vector indicates an action to be taken during a successive test cycle, such as asserting a test signal or sampling the DUT output signal. Each test vector also indicates a relative time during the test cycle that the action is to be taken. For long test operations requiring many test vectors, the memory that would be required to store a test vector sequence for each node would be very large. But instead of storing the sequence of test vectors itself, each node 14 stores algorithmic instructions for generating the sequence of test vectors and each node 14 includes circuits for processing the algorithmic instructions to produce the test vector sequence. Each test vector is generated in "real time" immediately so as to be transparent to the test vector at the flow DUT before it is needed at the start of a test cycle. Since an algorithm for generating a sequence of test vectors is much smaller than the sequence itself, each node requires much smaller memory to store the algorithm than would be needed to store the test vector sequence the algorithm generates.

The processing nodes 14 are interconnected in a loop by transmission lines 18, 19 operating as network interface to form a loop network for conveying the algorithmic instructions, as well as control data and signals to each node. A host interface circuit 20, interconnected in the network in place of a node, provides a host computer 22 with access to the network via a bus 24. A reference oscillator clock signal ROSC produced by a clock circuit 25 of FIG. 1 provides a common timing reference to all nodes 14 so that their operations may be synchronized during a test operation in a manner described below.

Figure 2:
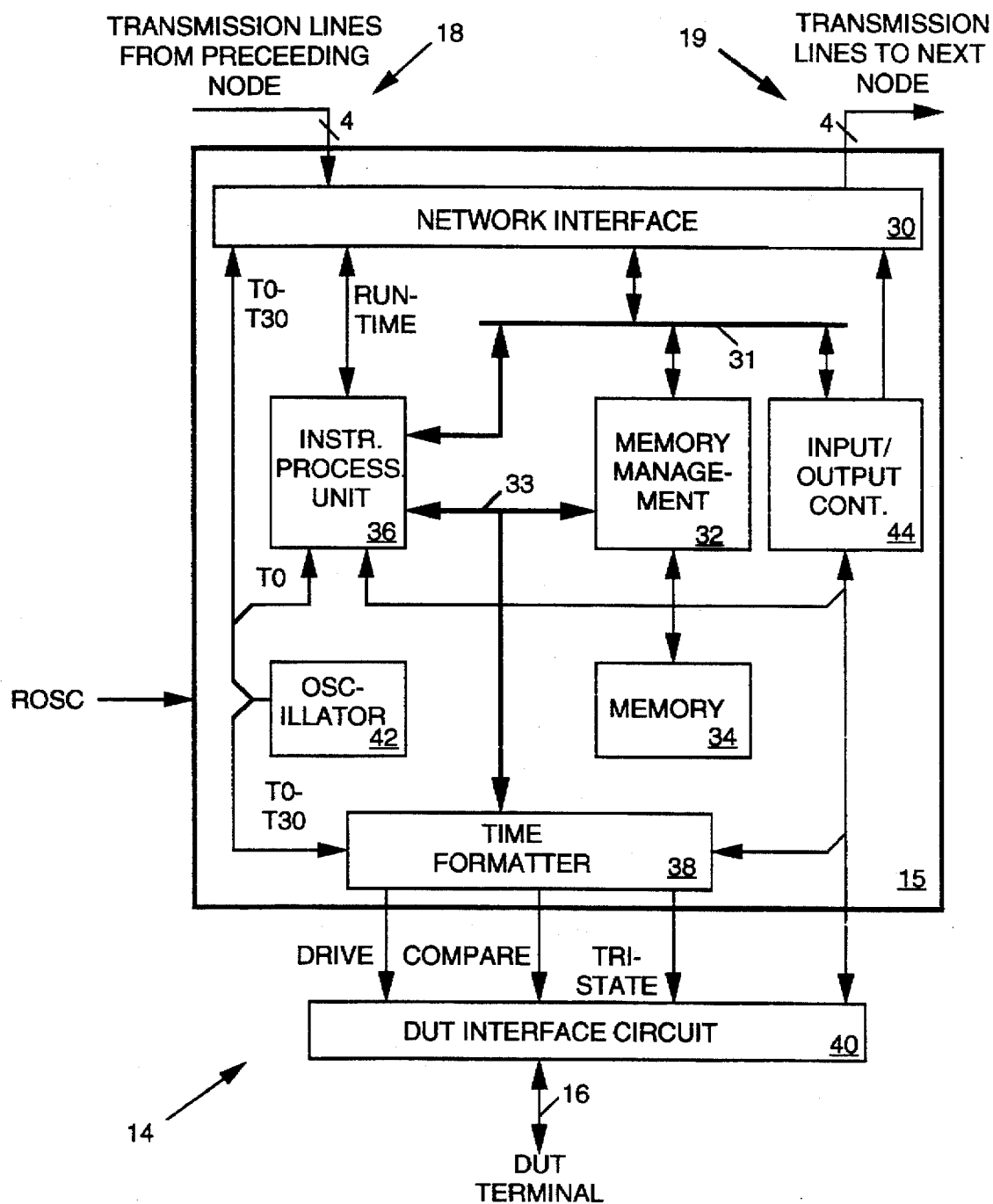
FIG. 2 is a block diagram of a typical node of the integrated circuit tester of FIG. 1.

FIG. 2 is a block diagram of a typical node 14 of tester 10 of FIG. 1. Node 14 includes network interface 30 for interfacing the node to the unidirectional incoming and outgoing serial transmission lines 18 and 19 linking the node to preceding and next nodes of the network loop. Four incoming transmission lines 18 and four outgoing transmission lines 19 link each node to its nearest neighbors. Node 14 also includes a memory management unit 32, an instruction memory 34 and an instruction processing unit 36. The instruction memory 34 is suitably a conventional addressable random access memory (RAM) for storing the algorithmic instructions. The memory management unit 32 is a conventional RAM controller for controlling read and write access to memory 34. Each network interface 30 receives serial data and addresses via an incoming transmission line 18 and forwards them to a next node of the network loop via an outgoing transmission line 19. Each network interface 30 may also convert the serial data and address words to a parallel form and forward them to a local bus 31. Memory management unit 32 determines whether memory 34 is being addressed and if so stores the data (the algorithmic instructions) in memory 34. During a test, instruction processing unit 36 transmits memory addresses to memory management unit 32 via 24-bit bus 33 and the memory management unit reads instructions out of memory 34 at those addresses and forwards the instructions to processing unit 36 via local bus 31.

As mentioned above, an integrated circuit test is divided into a succession of test cycles. During a test, as the processing unit 36 executes the algorithmic instructions stored in memory 34 it generates one test vector during each test cycle. Each test vector is sent to a time formatter circuit 38 which controls the operation of a DUT (device under test) interface circuit 40. Interface circuit 40 includes an input/output port connected by a probe or other conductor 16 to the DUT. During each test cycle DUT interface circuit 40 may transmit a test signal to the DUT via conductor 16 or may sample an output signal generated on conductor 16 by the DUT and store data representing the sampled signal magnitude. Each test vector may tell time formatter 38 when, during the following test cycle, to selectively assert or deassert any of a set of three signals, DRIVE, COMPARE, and TRISTATE. The time formatter 38 asserts or de-asserts the TRISTATE signal to tell the DUT interface circuit 40 to drive conductor 16 with a test signal. The DRIVE signal is asserted and de-asserted to tell the DUT interface circuit 40 to drive the test signal high or low. The COMPARE signal is asserted and de-asserted to tell the DUT interface circuit 40 when to begin or end sampling a signal generated by the DUT.

An input/output (I/O) controller 44 tied to local bus 31 communicates with other nodes in the network or with the host computer 22 of FIG. 1 via network interface 30 and transmission lines 18, 19. Before the start of a test operation, I/O controller 44 receives control data from the host computer via the network and stores that data in various registers within network interface 30, instruction processing unit 36, time formatter 38 and DUT interface circuit 40. The control data sets various modes of operation of these devices during a test as discussed herein below. After a test is completed, I/O controller 44 enables the host computer or other device to read sampled test data out of an acquisition memory within DUT interface circuit 40.

Node 14 also includes connections between network interface 30 and processing unit 36 for conveying incoming and outgoing RUNTIME control signals. These RUNTIME signals may be transmitted through selected transmission lines 18, 19 to signal the start and end of test operations. The RUNTIME signals may also provide communication between nodes during test operations, for example to indicate changes in mode of operation or errors that occur during a test.

An oscillator circuit 42 included in each node 14 helps to synchronize the operations of all of the nodes of the network during a test operation. Oscillator circuit 42 produces a set of timing signals T0–T30 transmitted to time formatter 38 and network interface 30. These timing signals T0–T30 have the same frequency as the ROSC signal but are time shifted one from another to divide the period of the ROSC signal into 31 segments of substantially equal duration. In each node 14, the T0 timing signal clocks instruction processing by the instruction processing unit 36. In response to each test vector, the time formatter 38 selects one timing signal from among the timing signals T0–T30 as a reference for timing the action indicated by the test vector. Since the T0–T30 signals of all nodes are maintained in the same phase relationship to the ROSC signal, the T0–T30 signals of each node are in phase with similar signals in every other node. When instruction processing and event timing in each node are referenced to the T0–T30 signals, the activities of all nodes can be synchronized.

The ROSC signal, and therefore the T0 signal, is suitably set to the speed of operation of a microprocessor within processing unit 36. It is desirable, however, that timing of the COMPARE, DRIVE and TRISTATE signals be controllable with higher resolution. The T0–T30 signals resolve time to 1/31 st of a ROSC cycle, but as discussed herein below, time formatter 38 includes circuitry which can further resolve its output signal timing by a factor of 16. Devices 30, 32, 34, 36, 38, 42 and 44 are suitably implemented on a single large scale integrated circuit 15 using CMOS logic technology. Assuming a 100 Mhz ROSC signal, suitable for 0.8 micron CMOS technology, node 14 can resolve COMPARE, DRIVE and TRISTATE signal timing edges to about 20 psec. With 0.4 micron technology, a 200 MHz ROSC signal will permit 10 psec resolution.

TIMING CIRCUITS

Figure 3:
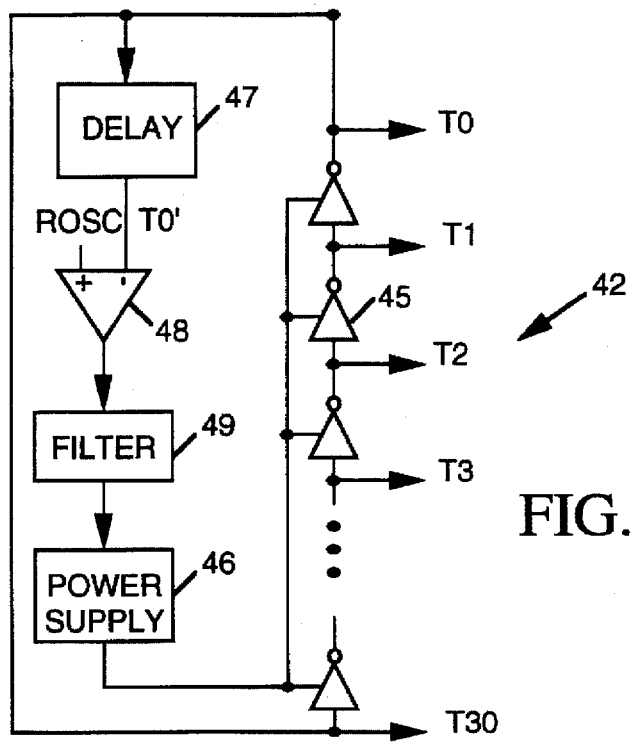
FIG. 3 is a block diagram depicting the oscillator of FIG. 2.

FIG. 3 is a block diagram depicting the phase locked oscillator 42 of FIG. 2 used to help synchronize operations of all nodes 14 of the tester of FIG. 1. Oscillator 42 includes a set of 31 identical inverters 45 connected in series to form a loop. A signal pulse circulates around the loop at a rate determined by the propagation delay time of inverters 45. This delay time is controlled by the output voltage of a power supply 46 supplying power to all inverters 45. The timing signals T0–T30 are taken at the connections between inverters 45. Since the propagation delay of all inverters 45 are substantially the same, signals T0–T30 are all phase shifted one from one another by substantially equal amounts. The T0 signal, delayed by a delay circuit 47 is supplied as signal T0' to one input of a comparator 48. The ROSC signal is supplied to another input of the comparator. Whenever a ROSC signal pulse precedes a T0' pulse, the output of comparator 48 goes high. When a T0' pulse precedes a ROSC signal pulse, the output of comparator 48 goes low. The output of comparator 48 is filtered by a filter 49 and supplied to power supply 46. The voltage of the output of filter 49 controls the power supply 46 output voltage.

The feedback provided by devices 46–49 phase locks the T0' signal to the ROSC signal to ensure that the T0–T30 signals have the same frequency as the ROSC signal with each having a slightly different phase. Since the T0–T30 signals are phase shifted one from another by equal amounts, the time between successive T0–T30 is equal to 1/31 st of the period of the ROSC signal. It should be understood that in alternative embodiments elements 45 may be devices other than inverters such as, for example, current starved buffers or differential elements.

In order for the system of FIG. 1 to properly test a DUT 12, those nodes 14 transmitting test signals to the DUT and those nodes 14 acquiring sample data from signals produced by the DUT must do so at precise times relative to one another. The ROSC signal sent to all nodes 14 provides a reference for synchronizing their respective timing signals T0–T30. For example, if two nodes each transmitted a test signal pulse to the DUT when they each detected a pulse of the T5 signal, then the two test signals would be transmitted to the DUT at the same time since the two T5 signals, presumably phase shifted from the ROSC signal by the same amount, would be in phase with one another. However, the two test signals would not necessarily be in phase for two reasons. First, when the signal processing speeds of the two nodes differ, the times two nodes 14 require to generate their test signals upon detection of their T5 signal pulses may differ. The two nodes are implemented on different integrated circuits and variations in chip fabrication parameters can affect processing speed. Also the two nodes, being physically separate, may operate in different ambient temperatures. Chip temperature affects processing speed.

To solve this problem, the delay circuit 47 is included in the feedback loop of oscillator 42 of FIG. 3. Delay circuit 47 phase shifts the T0–T30 signals forward in time by an amount that accounts for the processing delay of time formatter 38 of FIG. 2. Delay circuit 47 is simply a series of gates having the same channel width (and therefore delay) as the gates that process the T0–T30 signals to control the COMPARE, DRIVE and TRISTATE signals. Since oscillator 42 and time formatter 38 are implemented on the same integrated circuit 15, any process or environmental changes affecting the signal propagation speed through the time formatter 38 of FIG. 2 will affect the delay of the delay circuit 47 of FIG. 3. The delay circuit 47 of each node therefore automatically adjusts its own delay to phase shift the signals T0–T30 by appropriate amounts to account for the differences in propagation delay through the node's time formatter. Thus, for example, a T5 pulse of a slow node occurs before the T5 pulse of a faster node so that COMPARE, DRIVE or TRISTATE signals asserted by both nodes in response to the T5 pulse are in fact asserted at the same time.

A second timing problem arises because the ROSC signal may not arrive at all nodes 14 of FIG. 1 at the same time. The nodes are physically separate and the ROSC clock 25 of FIG. 1 is more distant from some nodes than others. Therefore, even though the timing signal T5 pulses of the two nodes are phase shifted from ROSC signal pulse by the same amount they would not themselves be in phase. The present invention overcomes this problem by providing for calibration of delay circuits within the time formatter 38 within each node, allowing small adjustments in delay to account for difference is ROSC signal arrival time. Such calibration is discussed herein below in connection with details of the time formatter.

Figure 4:
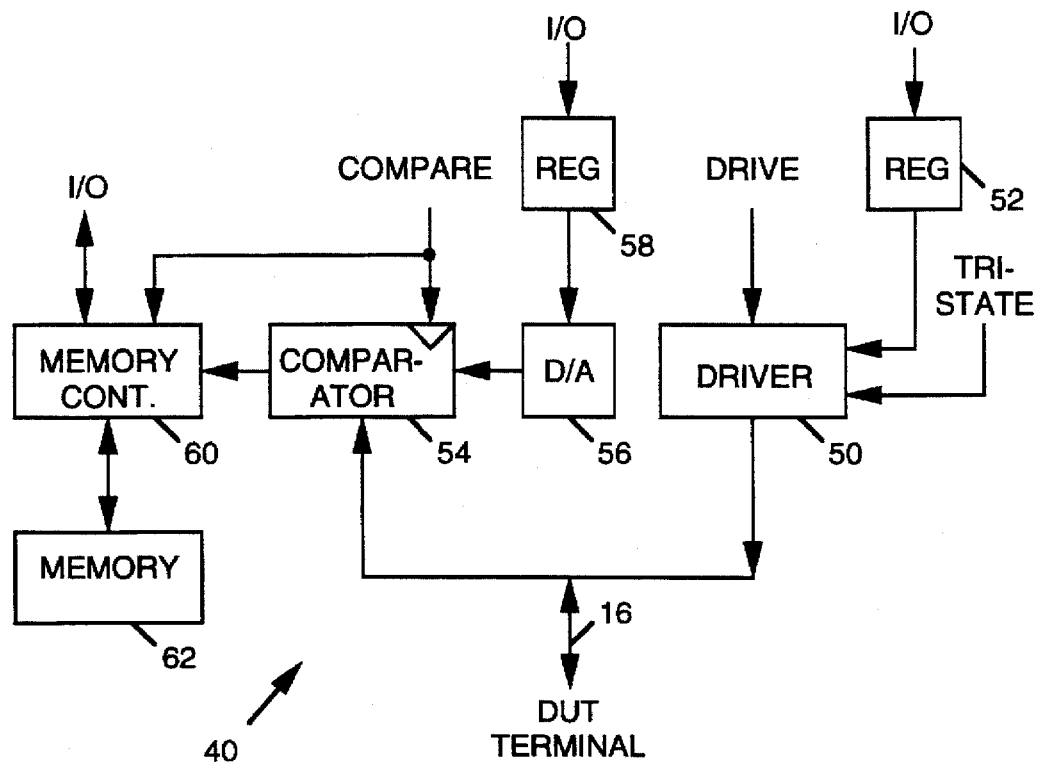
FIG. 4 is a block diagram of the DUT interface circuit of FIG. 2.

FIG. 4 is a block diagram of DUT interface circuit 40 of FIG. 2. Circuit 40 includes a conventional tristate driver circuit 50 for supplying the test signal transmitted to the DUT via conductor 16. Driver circuit 50 receives the DRIVE and TRISTATE signals from the time formatter 38 of FIG. 2. The TRISTATE signal determines whether the driver transmits its test signal output to the DUT via conductor 16. The DRIVE input signal controls the logical state of the test signal output. Driver 50 is programmable in the sense that the logic levels of its test signal output can be adjusted depending on the requirements of the DUT. A register 52 stores control data transmitted thereto from the host computer via the I/O controller 44 of FIG. 2 prior to a test operation. The data in register 52 supplied to driver 50 controls test signal logic levels.

DUT interface circuit 40 also includes a comparator 54. Comparator 54 compares a signal generated by the DUT on conductor 16 with an analog signal output of a digital-to-analog (D/A) converter 56. The magnitude of the D/A converter 56 output signal is controlled by data stored in a register 58 indicating a breakpoint between logical true and logical false state of the DUT output signal. The host computer loads data into register 58 via the I/O controller prior to the start of a test operation. When the COMPARE signal from the time formatter 38 of FIG. 2 is asserted, comparator 54 produces an output data bit indicating whether the voltage of the DUT output signal is higher than the D/A converter 56 output signal. When the COMPARE signal is next de-asserted, a memory controller circuit 60 stores the bit in an acquisition memory 62. During a test operation, acquisition memory 62 may thus acquire and store a sequence of data values. Thereafter the host computer, operating through I/O controller 44 of FIG. 2, may sequentially read the acquired data out of memory 62 via memory controller 60 for subsequent analysis.

Figures 5, 5A:
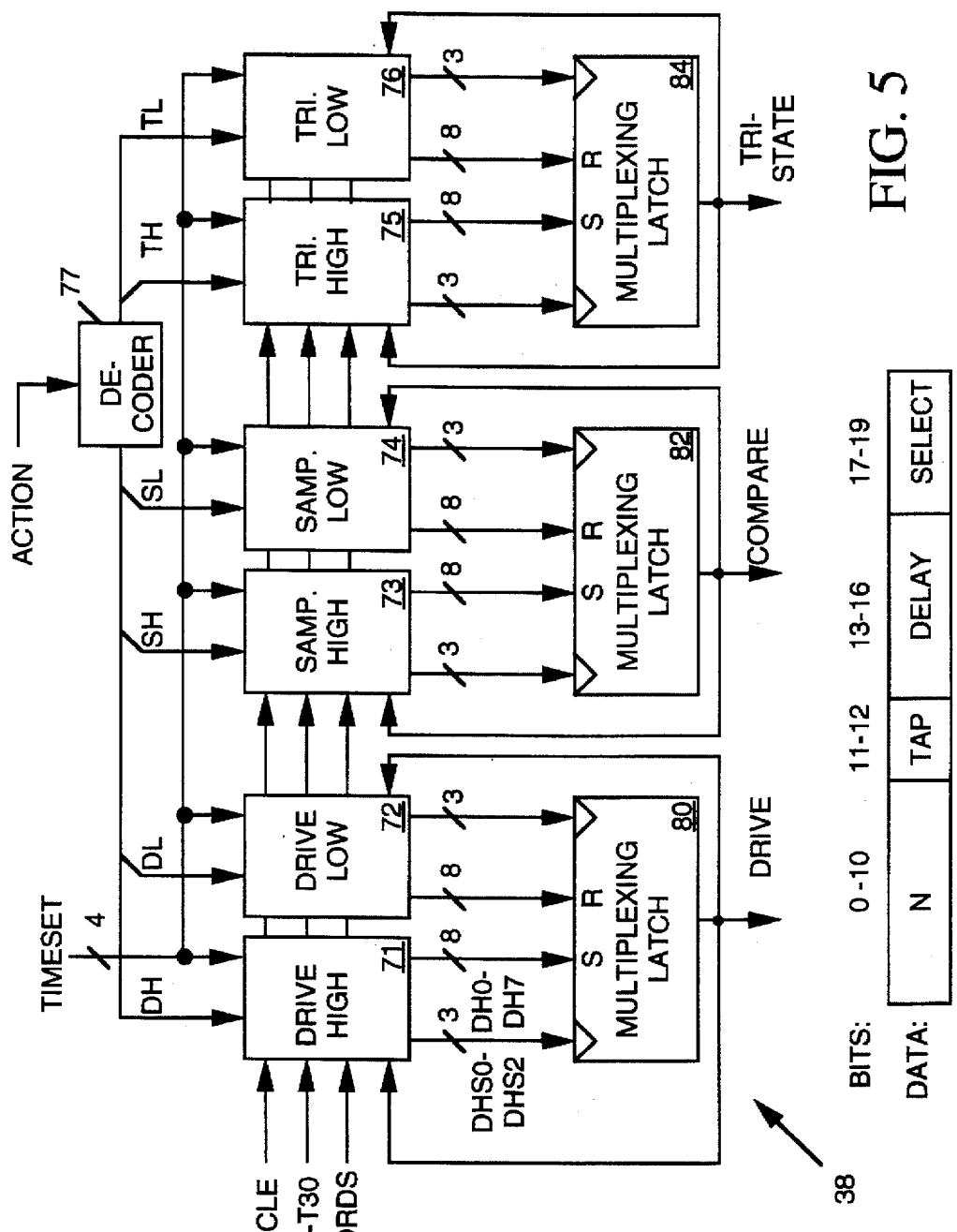
FIG. 5 is a block diagram depicting the time formatter of FIG. 2.
FIG. 5A is a representation of a data word stored by the time formatter of FIG. 2.

FIG. 5 is a block diagram depicting the time formatter 38 of FIG. 2. Time formatter 38 includes a set of six timing circuits 71–76, a decoder 77 and three multiplexing latches 80, 82 and 84. Drive high circuit 71 determines when the DRIVE signal is driven high, drive low circuit 72 determines when the DRIVE signal is driven low. Sample high circuit 73 and sample low circuit 74 determine when the COMPARE signal is driven high and low, respectively. Tristate high and low circuits 75,76 determine when the TRISTATE signal is driven high and low.

Each test cycle spans a selected number of cycles of the T0 timing signal. The instruction processing unit 36 of FIG. 2 transmits an 8-bit test vector to the time formatter 38 immediately prior to the beginning of each test cycle. Each test vector includes two 4-bit nibbles TIMESET and ACTION. TIMESET indicates a particular one of sixteen times at which time formatter 38 is to carry out an action during the next cycle. ACTION indicates which of the six timing circuits 71–76 are to carry out the action. TIMESET is decoded by decoder circuit 77 to provide six control signals, DH, DL, SH, SL, TH and TL supplied to circuits 71–76, respectively. When a control signal DH, DL, SH, SL, TH or TL is asserted, the circuit 71–76 that receives it responds by initiating its action during the next test cycle at the time indicated by TIMESET. Thus ACTION selects an action or actions to be taken during the next test cycle by selecting the particular timing circuit(s) 71–76 to receive TIMESET. Table I below indicates the permissible combinations of the ACTION nibble bits, and the DH, DL, SH, SL, TH and TL bit response of decoder 77. Table I also indicates which circuits 71–76 store TIMESET in response to the combination of DH, DL, SH, SL, TH and TL signal states.

TABLE I

| ACTION | DH | DL | SH | SL | TH | TL | DRIVE | COM-PARE | TRI-STATE |
|---|---|---|---|---|---|---|---|---|---|
| 1000 | 1 | 0 | 0 | 0 | 1 | 0 | HIGH | | HIGH |
| 0100 | 0 | 1 | 0 | 0 | 1 | 0 | LOW | | HIGH |
| 0010 | 0 | 0 | 1 | 0 | 0 | 1 | | HIGH | LOW |
| 0001 | 0 | 0 | 0 | 1 | 0 | 1 | | LOW | LOW |
| 0000 | 0 | 0 | 0 | 0 | 0 | 1 | | | LOW |

As mentioned above, the transitions between test cycles are marked by successive pulses of the NEWCYCLE signal supplied to each circuit 71–76. Each timing circuit 71–76 receives and stores a set of sixteen "TIMEWORDs" sent by host computer 22 of FIG. 1 via the I/O controller 44 of FIG. 2 before the test begins.

FIG. 5A is a representation of a TIMEWORD that may be stored in circuits 71–76. Referring to FIGS. 5 and 5A, when for example circuit 71 is addressed by its DH input at the beginning of a test cycle (as indicated by the NEWCYCLE signal), circuit 71 responds by counting T0 signal cycles up to the number N indicated by the first 11 bits (bits 0–10) of the selected TIMEWORD. Circuit 71 then selects a particular subgroup DH0–DH7 of eight of the 31 T0–T30 timing signals, delays them by a selected amount, and passes them on to a "set" input of multiplexing latch 80 as its output signals DH0–DH7. Bits 11 and 12 (TAP) of the TIMEWORD, as shown in FIG. 5A, indicate which particular subgroup (DH0–DH7) of eight of the 31 timing signals T0–T30 are selected. Bits 13–16 (DELAY) indicate the amount by which those eight timing signals are delayed. In the meantime, the drive high circuit 71 also forwards the last 3 bits (SELECT) of the TIMEWORD as selection signals DHS0–DHS2 to a "set selection" input of the multiplexing latch 80. In response to the DHS0–DHS2 bits, multiplexing latch 80 selects one of the eight timing signals DH0–DH7. When that one timing signal delivers a pulse to the set (input S) of multiplexing latch 80, the latch sets (drives high) its output signal DRIVE.

Thus when selected by TIMESET, a TIMEWORD stored in the drive high circuit 71 precisely indicates when the DRIVE signal is to be driven high during a next test cycle. In a similar manner, the drive low circuit 72 selects a TIMEWORD according to an input TIMESET nibble in response to the DL control signal. When selected by TIMESET, a TIMEWORD stored in drive low circuit 72 indicates when with respect to the next assertion of the NEWCYCLE signal, the DRIVE signal is to be driven low. The selected TIMEWORD causes dirve low circuit 72 to transmit 8 separate timing signals to reset (R) inputs of multiplexing latch 80 along with 3 control bits for selecting one of the 8 timing signals. Latch 80 then resets (drives low) the DRIVE signal in response to a pulse from the selected one of 8 timing signals.

The tristate high and low circuits 75,76 operate in a similar manner when addressed by the TH and TL signals. Multiplexing latch 82 produces the COMPARE signal in response to timing signals from sample high circuit 72 and sample low circuit 73. Multiplexing latch 84 produces the TRISTATE signal in response to signals from tristate high circuit 75 and sample low circuit 76. These circuits operate in a manner similar to circuits 71, 72 and 80 to control the states of the COMPARE and TRISTATE signals.

Figure 6:
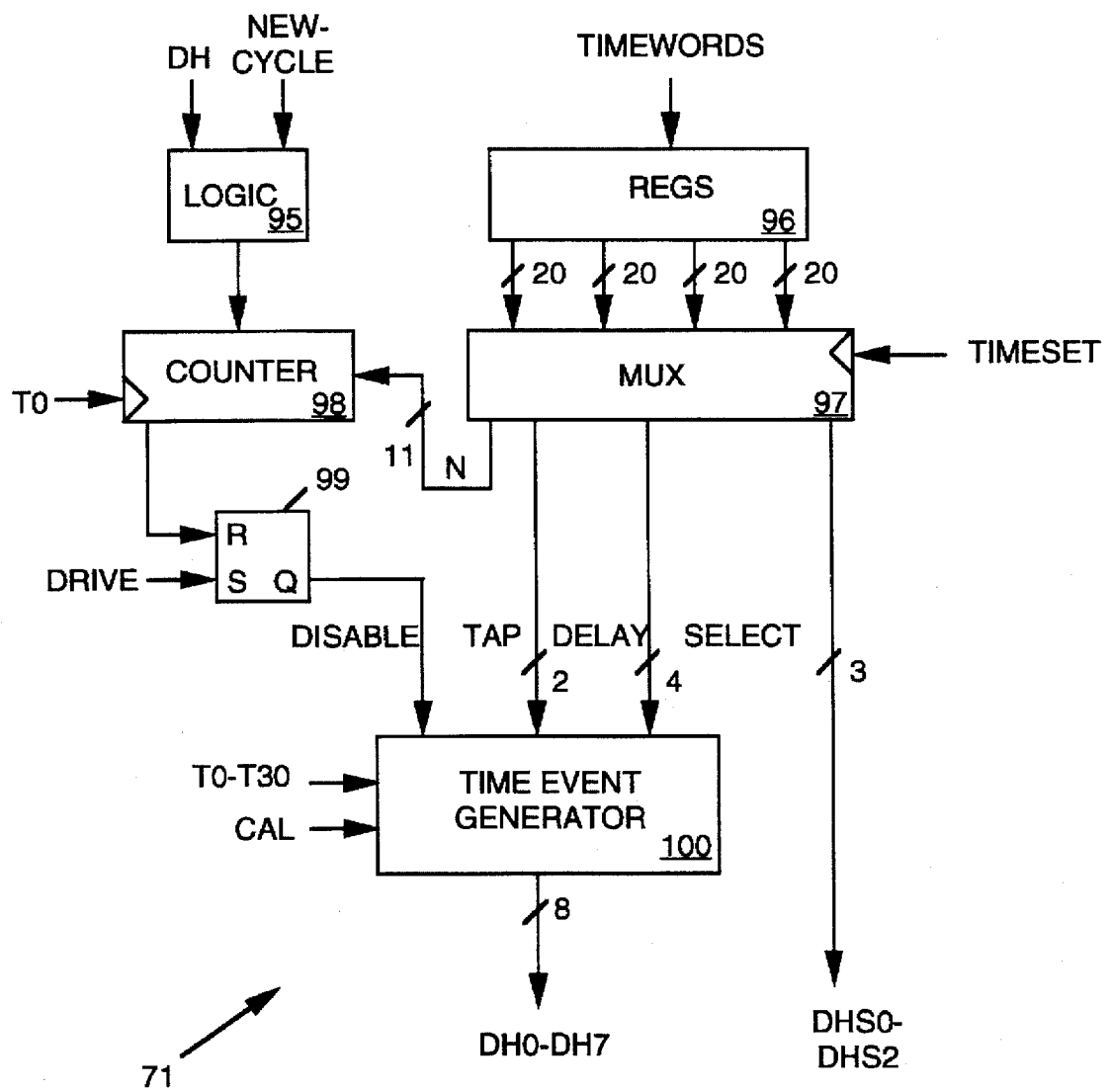
FIG. 6 is a block diagram depicting the drive high circuit of FIG. 5.

FIG. 6 is a block diagram depicting drive high circuit 71 of FIG. 5 in greater detail. Circuits 72–76 of FIG. 5 are similar. Before the test operation begins, the host computer, acting through the I/O controller 44 of FIG. 2, writes up to sixteen TIMEWORDS into a set of sixteen registers 96. The TIMEWORD stored in each register 96 is applied to a separate input of a multiplexer 97 switched by TIMESET. Multiplexer 97 forwards the six TAP and DELAY bits of the TIMEWORD from one selected register 96 to a time event generator (TEG) 100 which produces the DH0–DH7 timing signals. Multiplexer 97 also forwards the eleven N bits of the selected TIMEWORD to a counter 98. The DH enable signal and the NEWCYCLE signal provide inputs to a logic gate 95. When the DH signal is asserted, logic gate 95 delivers a next pulse of the NEWCYCLE signal to counter 98. Counter 98 then acquires the eleven N bits of the selected TIMEWORD. Counter 98 then begins counting pulses of the T0 signal. When counter 98 has counted N T0 pulses, it strobes a reset input of a flip-flop 99 which responds by driving its Q output (a DISABLE signal) low. The DISABLE signal is supplied to TEG 100, and when the DISABLE signal goes low, TEG 100 produces the DH0–DH7 timing signals. Thereafter, when the DRIVE signal goes high at a time indicated by the DH0–DH7 and DHS0–DHS2 signals, it drives the set input of flip-flop 98. The Q output of flip-flop 99 then goes high disabling TEG 100 so that it turns off its DH0–DH7 signals. As discussed herein below, the I/O control circuit 44 provides TEG circuit 100 with calibration data, CAL for concise control of the timing of the DH0–DH7 signals.

Figure 7:
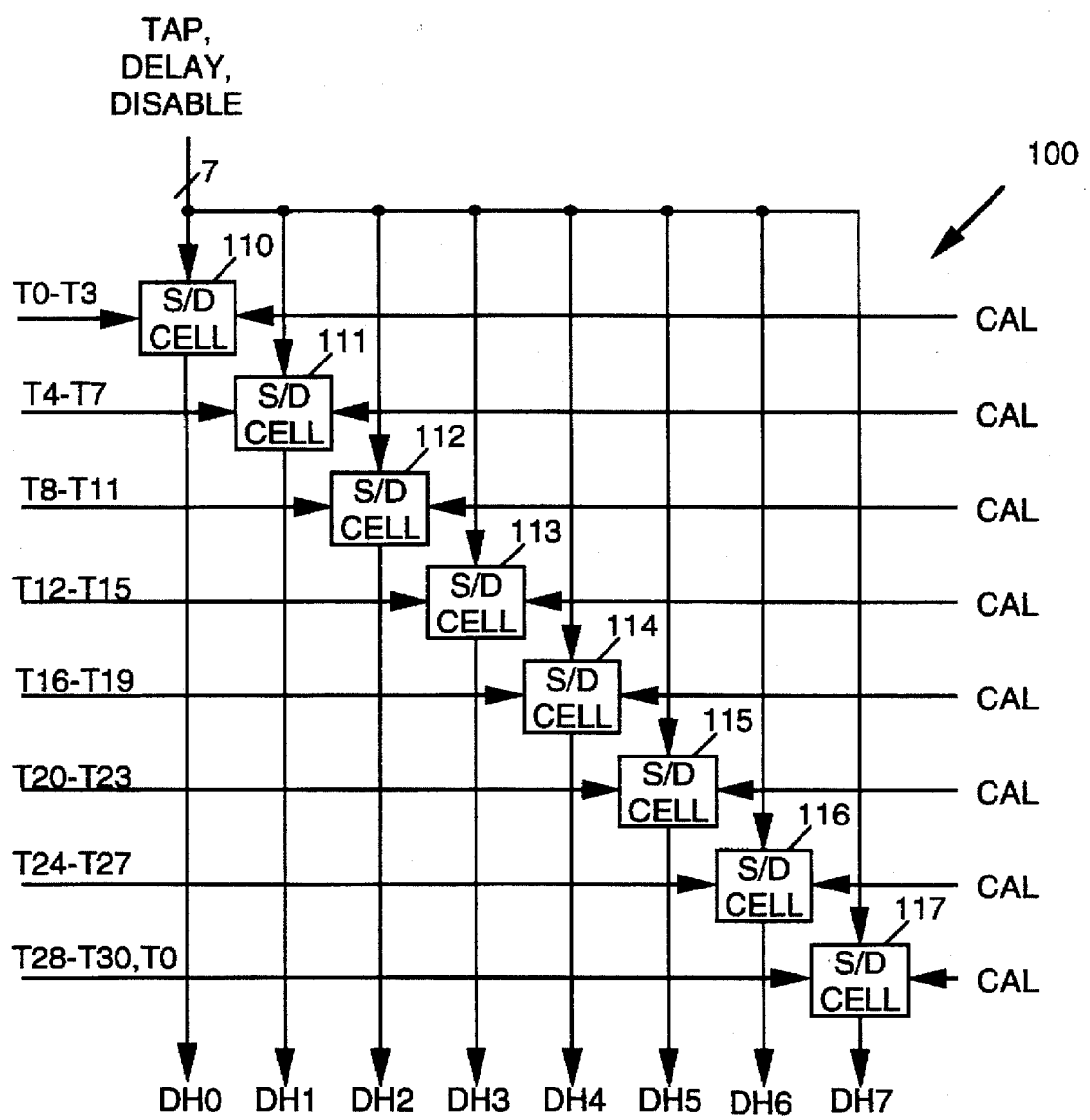
FIG. 7 is a block diagram depicting a typical time event generator of FIG. 6.

FIG. 7 is a block diagram depicting the time event generator (TEG) 100 of FIG. 6. TEG 100 includes a set of 8 identical select and delay (S/D) cells 110–117. When the DISABLE bit is low, S/D cell 110 selects one of timing signals T0–T3 to forward as timing signal DH0 in response to the 2 TAP bits of the TIMEWORD. As S/D cell 110 passes the selected tap signal T0–T3 onward as the DH0 signal, it delays the selected tap signal from 0 to 15 "delay units" as determined by the 4 DELAY bits. When the DISABLE bit is high, cell 110 pulls the DH0 low regardless of the states of the selected timing signal T0–T3. S/D cells 111–117 operate in a similar fashion, each selecting and adjustably delaying one of four oscillator tap signals in response to the TAP and DELAY bits to produce a corresponding output signal DH1–DH7, respectively. As discussed herein below each S/D cell also receives calibration data input from the I/O control circuit 44 of FIG. 2 which adjusts signal propagation delay through the S/D cells for reasons explained below.

The "delay unit" by which the S/D cells can delay the selected tap is 1/16 of the time difference between pulses of successive taps T0–T30 or 1/16th of the delay of one gate 45 of oscillator 42 of FIG. 3. While the phase locked oscillator 42 of FIG. 2 produces tap signals T0–T30 which divide the ROSC signal cycle into 31 time segments, the time event generator 100 can further subdivide each time segment into 16 subsegments. The DELAY data from the selected TIMEWORD adjusts the timing of each DH0–DH7 signal pulse in steps of 1/(31×16) or one 496th of a ROSC signal cycle. Thus by appropriately selecting and delaying a signal pulse DH0–DH7 we can obtain a reference signal pulse that occurs at any of 496 equally spaced times during a ROSC signal cycle.

Figure 8:
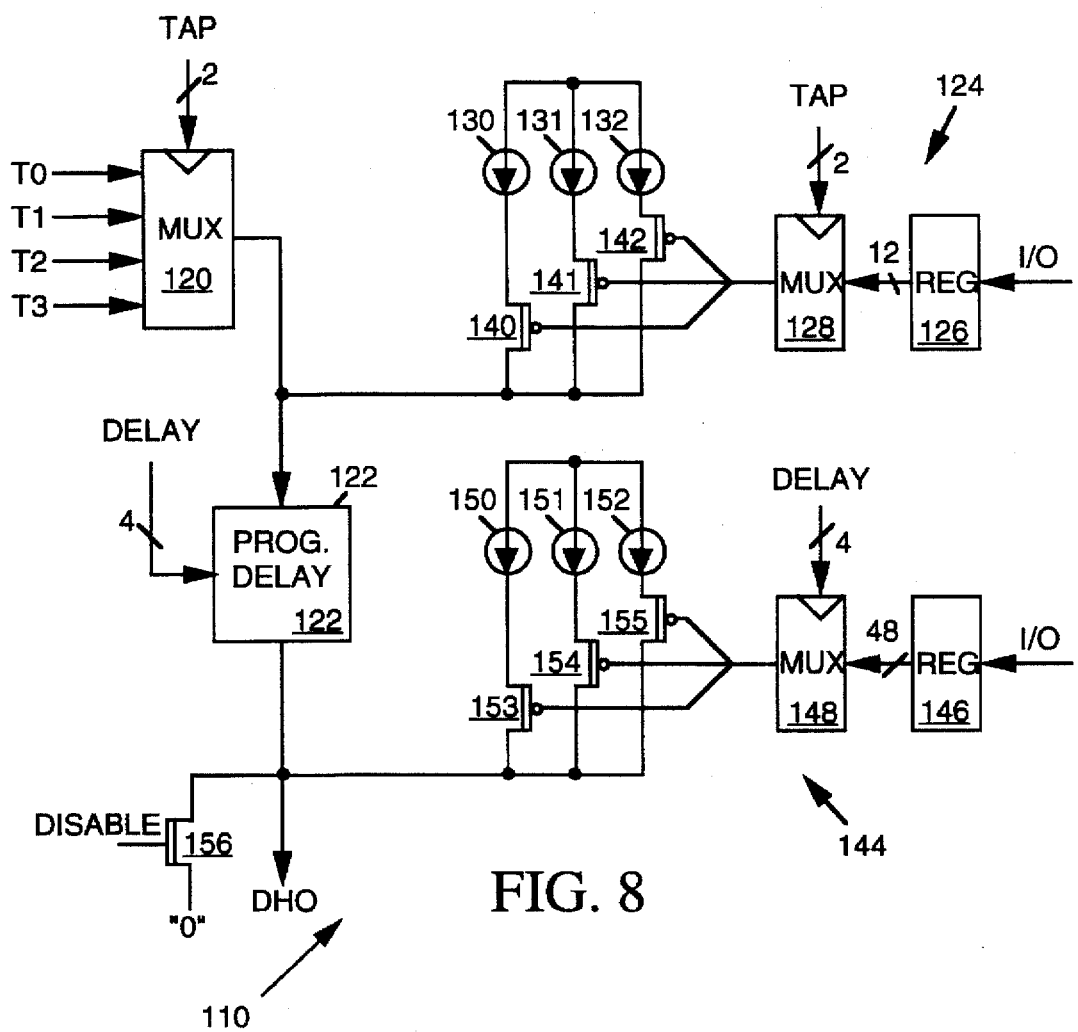
FIG. 8 is a combination block and circuit diagram depicting the TEG0 circuit of FIG. 7.

FIG. 8 is a combination block and circuit diagram depicting S/D cell 110 of FIG. 7. The other S/D cells 111–117 are similar. Referring to FIG. 8, S/D cell 110 includes a multiplexer 120 controlled by the two TAP signal bits. Multiplexer 120 selects one of tap signals T0–T3 to be forwarded to a programmable delay circuit 122. Responding to the four DELAY bits, delay circuit 122 delays the selected tap signal by from 0 to 15 delay units to produce the DH0 output signal. A transistor 156 controlled by the DISABLE bit couples the DH0 signal to a logical "0" (low) source when the DISABLE bit is high. Transistor 156 pulls the DH0 signal down after the DRIVE signal is asserted once during a test cycle so that the selected timing signal T0–T3 will not repeatedly assert the DRIVE signal during the remainder of the test cycle.

As discussed herein above, pulses of the ROSC signal of FIG. 1 arrive at the various nodes 14 at different times and this leads to timing differences between corresponding oscillator tap signals T0–T30 of the separate nodes. Also while the delay circuit 116 of FIG. 3 helps to compensate for node-to-node differences in signal propagation rates due to integrated circuit processing and environmental variations, other factors such as cyclic noise disturbances may give rise to small propagation rate differences. A pair of calibration circuits 124 and 144 further adjust propagation delay of the selected T0–T3 signal to ensure that the propagation delays provided by delay circuits 122 of the separate nodes are equivalent.

A calibration circuit 124 within S/D circuit 110 of FIG. 8 includes a register 126, a multiplexer 128, a set of current sources 130, 131, and 132, and three transistors 140, 141 and 142. Transistors 140–142 respectively couple current sources 130–132 to the input to delay circuit 122. Each bit of a three bit output of multiplexer 128 controls the gate of a separate one of transistors 140–142. The host processor via I/O circuit 44 of FIG. 2 stores 12 bits in register 126, three bits associated with each of the four tap signals T0–T4. Responsive to the value of the 2-bit TAP data, multiplexer 128 selects 3 of the bits in register 126 to control the switching states of transistors 140–142. Thus the particular current sources 130–132 coupled to the input of delay circuit 122 are selected according to which tap T0–T3 is currently selected and the value of associated data stored in register 126.

Current sources 130–132 produce currents of relative sizes 1, 2, and 4, respectively and by selectively turning on transistors 140–142, the amount of current supplied to the input of delay circuit 122 can be of any relative magnitude 0–7. This current precharges input capacitance of the delay circuit 122 so that when multiplexer 120 passes a signal on to the delay circuit, the delay circuit responds more quickly. By increasing the amount of current available for precharging that input capacitance we reduce the propagation delay. Thus the data loaded into register 126 separately calibrates the propagation delay for each timing signal T0–T3.

The second calibration circuit 144 includes a register 146, a multiplexer 148, a set of current sources 150, 151, and 152, and three transistors 153, 154 and 155. Transistors 153–155 respectively couple current sources 150–152 to the output of delay circuit 122. Each bit of the 3-bit output of multiplexer 148 controls the gate of a separate one of transistors 153–155. I/O circuit 44 of FIG. 2 stores 48 bits in register 146, three bits associated with each of the 16 possible delays selected by the 4-bit DELAY data. Responsive to the value of the 4-bit DELAY data, multiplexer 128 selects three of the bits in register 146 to control the switching states of transistors 153–155. Thus the particular current sources 150–152 coupled to the output of delay circuit 122 are determined according to the selected amount of delay in delay circuit 122 and the value of associated data stored in register 146. Calibration circuit 144 operates in a manner similar to calibration circuit 126 to adjust propagation delay in the circuit by pre-charging the input capacitance of the next stage so as to speed up or slow down the response of the next stage to the DH0 signal.

During a calibration process all nodes of FIG. 1 are operated so as to assert an output test signal at the same time and the DUT is replaced with equipment for measuring small time differences between signal pulses. With transistors 140–142 off, the delay of delay circuit 122 set to a minimum and multiplexer 120 in all nodes is switched to select T0. If all nodes are properly calibrated then all nodes will assert their test signals at the same time. Timing differences are monitored and the 3 data bits stored in register 126 associated with tap T0 are adjusted on an iterative basis for all of the nodes until they all produce their test output signals at the same time within the resolution provided by calibration circuit 124. The process is repeated for each of the reference signals T1–T3 for all of the nodes.

Thereafter the T0 tap is selected in each node, test signal timing is compared for all different delay settings of delay circuit 122 and the data in register 146 is iteratively adjusted to ensure that all nodes assert test signals at the same time for each setting of delay circuit 122 within the resolution afforded by calibration circuit 144. The calibration process is repeated for all S/D cells 111–117 of time event generator 100 of FIGS. 6 and 7 and for similar time event generators included in the sample low, sample high, sample low, tristate high and tristate low circuits 71–76, respectively, of FIG. 5.

Figure 9:
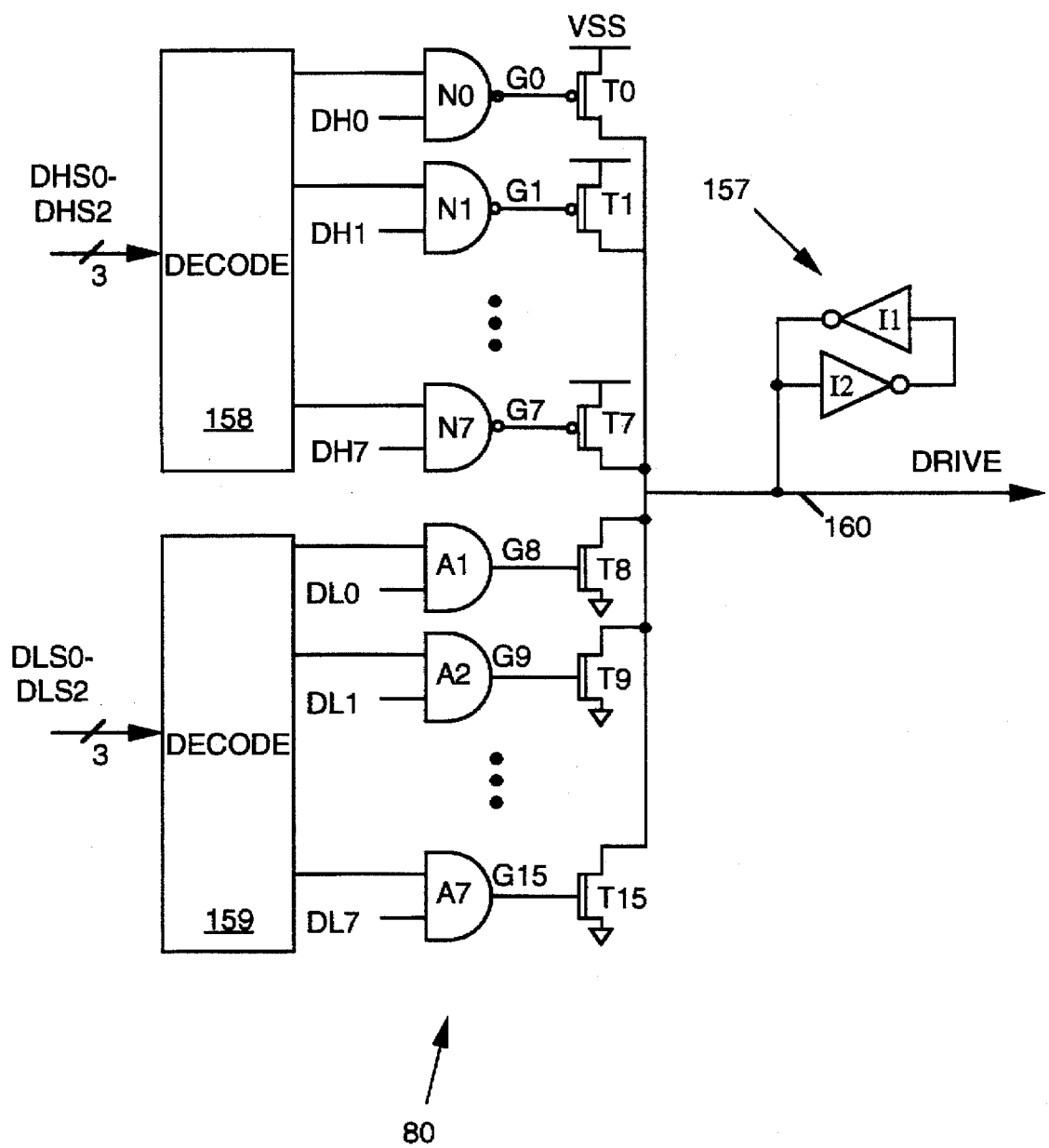
FIG. 9 is a combination block and circuit diagram depicting a typical multiplexing latch of FIG. 5.

FIG. 9 is a combination block and circuit diagram depicting a typical multiplexing latch 80 of FIG. 5. Multiplexing latches 82 and 84 are similar. Multiplexing latch 80 includes eight CMOS NAND gates N0–N7, eight CMOS AND gates A1–A7, eight pMOS transistors T0–T7, eight nMOS transistors T8–T15, a bistable latch 157 and a pair of decoders 158 and 159. Drive high select signals DHS0–DHS3 provide input to decoder 158. Decoder 158 has eight outputs, each driving an input of a separate one of NAND gates N0–N7 and each asserted in response to a separate combination of decoder input signals DHS0–DHS2. Decoder 159 decodes the drive low select signals DLS0–DLS2 to produce eight outputs, each driving an input of a separate one of AND gates A1–A7 in response to a separate combination of input signals DLS0–DLS2.

The DH0–DH7 drive high timing bits are applied to second inputs of NAND gates N0–N7, respectively, and the DL0–DL7 drive low bits are applied to second inputs of AND gates A1–A7, respectively. Outputs G0–G7 of NAND gates N0–N7 control gates of transistors T0–T7, respectively, and outputs G8–G15 of AND gates A0–A7 control gates of transistors T8–T15, respectively. The source of each transistor T0–T7 is tied to a common voltage source VSS while the source of each transistor T8–T15 is tied to ground. The drains of all transistors T0–T15 are connected together at a node 160. Bistable latch 157 consists of a pair of CMOS inverters I1 and I2. The output of I2 is connected to the input of I1, and the output of I1 is connected to the input of I2 as well as to circuit node 160. The latch output signal DRIVE appears at the circuit node 160.

In response to a particular DHS0–DHS2 bit pattern, decoder 158 drives high an input to, for example, NAND gate N0. When NAND gate N0 subsequently receives a pulse from timing signal DH0, it turns on transistor T0, thereby pulling the DRIVE signal high. As the DRIVE signal swings high, the output of inverter I2 goes low and in turn causes the output of inverter I1 to go high. After timing signal DH0 goes low, the output of inverter I1 continues to pull up on the DRIVE signal. Thus the DRIVE signal is latched high until reset.

Thereafter to reset the DRIVE signal to a low logic level, decoder 159, responding to some particular bit pattern in DLS0–2 drives high an input to, for example, AND gate A0. When AND gate A0 subsequently receives a pulse from timing signal DL0, it turns on transistor T8, thereby pulling the DRIVE signal low. Transistor T8 is relatively large compared to transistors forming inverters I1 and I2 and overcomes their latching action. As the DRIVE signal goes low, the output of inverter I2 goes high and in turn causes the output of inverter I1 to go low. After timing signal DL0 goes low, the output of inverter I1 continues to pull DRIVE low. The DRIVE signal thereafter remains in the low logic state until reset to a high state by one of the drive high signals DH0–DH7.

TESTER PROGRAMMING

Algorithmic instructions for IC simulators are often written in a hardware description language (HDL), used by electronic hardware designers to design integrated circuits. To test an IC design, a designer can provide the HDL description of the IC as input to a computer program that simulates the behavior of an integrated circuit. The designer also provides an HDL "testbench." The "testbench" is a test procedure that includes transmitting test signals to various nodes of the IC and sampling outputs of the IC at specific times. The simulator performs the indicated test procedure and produces waveform displays or other indications of the behavior of the simulated IC. Table II illustrates a simple HDL test description for an IC having two nodes "inx" and "iny".

TABLE II

| Code | Meaning |
| --- | --- |
| #0 | at time zero |
| 0*inx | set pin node "inx" to "0" |

TABLE II-continued

| Code | Meaning |
|---|---|
| 1*iny | set pin node "iny" to "1" |
| #250 | at time 25.0 nanoseconds |
| 0*iny | set pin node "iny" to "0" |
| #1001 | at time 100.1 nanoseconds |
| 1*inx | set pin node "inx" to "1" |

These few lines of HDL code tell the simulator to drive nodes inx and iny low at time 0, to drive a node "iny" high 25 nanoseconds into the test, and to drive node inx high 100.1 nanoseconds into the test. The simulator must control the state of each IC node during each cycle of the test. If a test cycle were 0.1 nanoseconds long, then the simulator must tell the simulator what to do at node inx in each of 1001 test cycles. In performing the simulation, a prior art IC simulator produces a sequence of test vectors of the form (inx, iny), each indicating the desired states of the inx and iny nodes during a successive test cycle. Thus if the test were 100.1 nanoseconds long and each test cycle was 0.1 nanosecond, the simulator would generate a sequence of 1001 test vectors. When a simulated IC has hundreds of nodes tested over millions of test cycles, the simulator must generate an enormous sequence of test vectors to define activities at each node during each cycle of the test. However to save memory, the simulator does not produce the entire sequence before starting the test. The simulator produces a test vector at the beginning of a test cycle and then simulates the IC behavior during that cycle. The simulator then suspends the simulation (i.e. suspends simulation "time") while it generates a test vector for a next test cycle. It then resumes the simulation to determine how the simulated IC responds to the new test vector during the next test cycle. The simulator can start and stop "time" in this fashion because the test of a simulated IC need not be carried out in real time.

However real IC's are not as easy to test as simulated IC's. Prior art integrated circuit testers cannot stop time during an integrated circuit test while they generate test vectors. Therefore prior art IC testers generate and store all test vectors before a test starts so that the test vectors will be available when need in real time. Because tester vector memory size and resource are limited, an IC tester typically cannot perform a test on a real IC that includes as many test cycles as test performed by a simulator on a simulated IC. Thus tests performed by IC simulators and prior art IC testers are not directly comparable.

The tester of the present invention resolves the problem by providing circuitry that can generate test vectors as generated by simulator testbench in real time from compact sets of algorithmic instructions stored in the tester memory. Morever, the instructions are developed from the same HDL test descriptions that may be provided as into to an IC simulator, thereby eliminating the need for developement of seperate test instructions for the IC simulation and testing phases of IC developement.

Figure 10A:
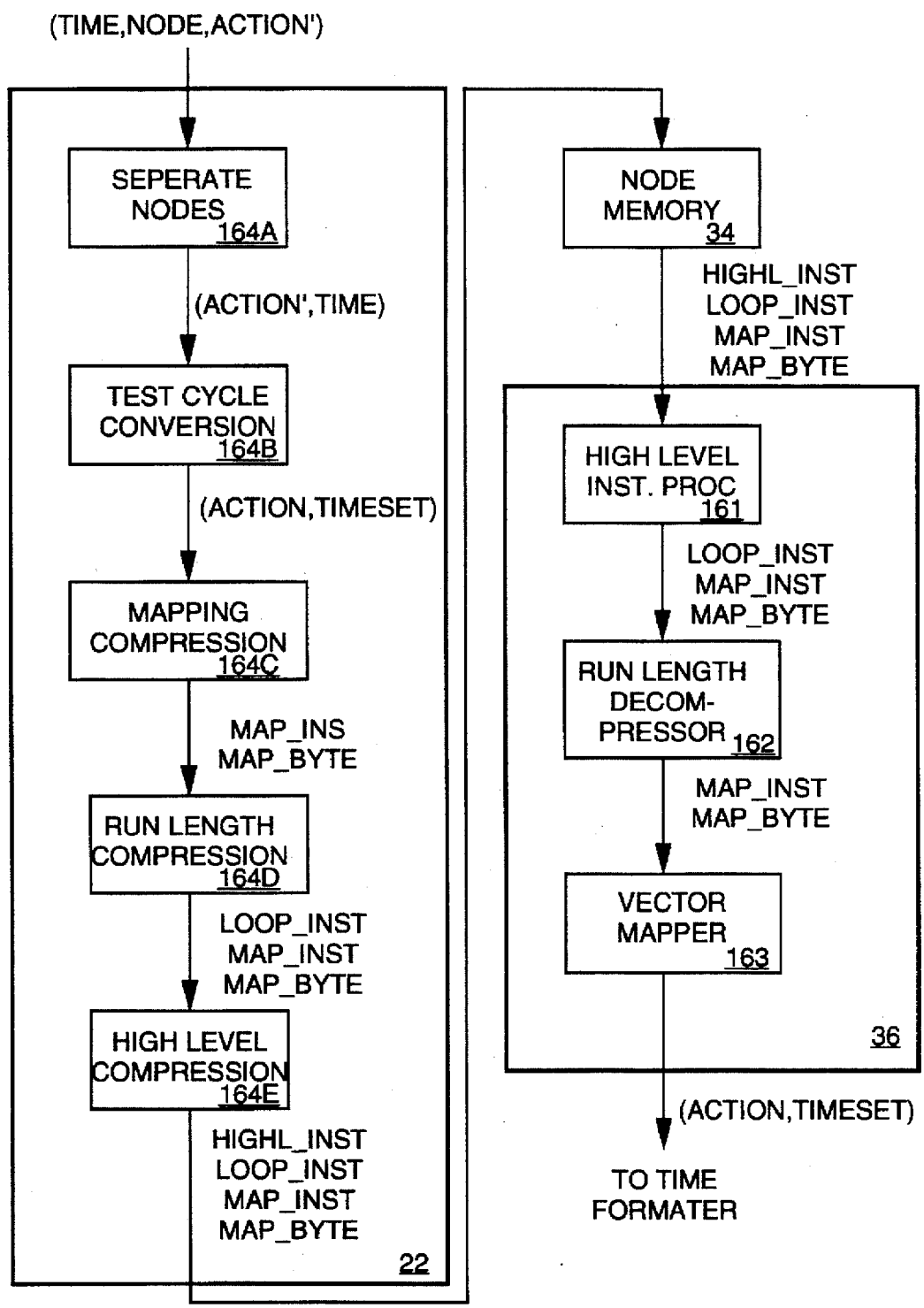
FIG. 10A is a data flow diagram illustrating steps in compressing a hardware description language into algorithmic form and decompressing the algorithm into test vector form.

FIG. 10A illustrates how data flows through the integrated circuit tester of the present invention. The tester uses a hardware description language (HDL) input to describe the test of the integrated circuit. A user supplies a HDL description of the test as input to the host computer 22 of FIG. 1 and the host computer converts the HDL testbench description to a set of highly compressed algorithms and stores them in the tester's node memories 34. Initially the host computer 22 receives the HDL code, a sequence of data in which items of the sequence are of the form (TIME, NODE, ACTION') as per TABLE II. TIME indicates a time the node is to take an action relative to the beginning of the test, NODE indicates which node is to take the action, and ACTION' indicates the action to be taken. In a first step 164A, the host computer separates the HDL code sequence describing actions at all nodes of the tester into several code sequences, each describing the actions to be taken at each separate node. Each item of the sequence is then of the form (TIME,ACTION'). Since each sequence is specific to a separate node, the algorithm need not identify the node.

Next at step 164B the host computer converts the code to a sequence of 1-byte test vectors in which each successive byte of the sequence relates to a successive cycle of the test and is of the form (ACTION, TIMESET). Here ACTION is a four-bit nibble indicating the action to be taken by the node during the test cycle and TIMESET indicates a particular time relative to the beginning of the test cycle that the action is to be taken. Note that TIMESET differs from TIME of the previous sequence in that TIMESET indicates a relative time within a test cycle whereas TIME indicates a total time from the beginning of the test.

The (ACTION, TIMESET) test vector sequence is then subjected to a first level of compression at step 164C to produce a sequence wherein each item may be either a 9-bit mapping instruction (MAP_INST) or a 9-bit mapping byte (MAP_BYTE). Mapping compression makes use of the fact that in most integrated circuit tests successive actions at a particular node are often similar in some respect. For example, successive actions at a node may occur at the same relative time within a test cycle. Or the range of successive actions at a node may be restricted, for example to turning on and off a high level test signal. If, for example, the value of TIMESET does not change during successive cycles, then the TIMESET information conveyed in successive (ACTION,TIMESET) vectors becomes repetitive.

Assume that only the first bit of the ACTION nibble changes from cycle to cycle and that such changes always occur at the same time. (The first test signal alternates between high and tristate.) Then all (ACTION, TIMESET) bytes of the sequence will be similar but for changes in the first bit of the ACTION nibble. (See Table I above.) To map such a sequence, the initial values of TIMESET and ACTION are established by a first MAP_BYTE of the form (0,ACTION, TIMESET). The "0" first bit indicates that it is a MAP_BYTE conveying data rather than an instruction. The TIMESET and ACTION nibbles are the same as in the first (ACTION, TIMESET) vector of the input sequence to step 164C. The next byte of the step 164C output sequence is a mapping instruction MAP_INST of the form (1, INST). The "1" bit indicates that this is an instruction and the 8-bit INST code indicates a particular mapping mode that the tester node is to enter. In the example case the INST code indicates a DRIVE1_MAP mode of operation in which the node uses the last TIMESET value for all subsequent test cycles and until further notice. Thereafter each 9-bit MAP_BYTE byte of the sequence is of the form (0,DRIVE1) where the first bit is a "0" to indicate that this is MAP_BYTE data rather than another instruction and wherein DRIVE1 is an 8 bit byte wherein the eight successive bits indicate how the first bit of the ACTION nibble is to change during eight successive test cycles. Thus a 9-bit DRIVE1_MAP mapping instruction and a 9-bit MAP_BYTE convey the same information as eight successive (ACTION, TIMESET) test vectors. Once a mapping mode is established with a mapping mode instruction, the system remains in that mode until the mode is changed by another instruction. Large numbers of MAP_BYTE bytes may follow a MAP_INST instruction. In such case the overhead of the mapping instruction becomes insignificant and the mapping ratio is 8/1 where a single MAP_BYTE replaces eight (ACTION, TIMESET) test vectors.

Eight types of mapping instructions, along with the format for the eight bit data portion of the MAP_BYTE bytes that follow each instruction type, are listed below in Table III. Each instruction is of the form (1,MAPMODE) where the first bit is "1" indicating that the byte is an instruction, and the remaining 8 bits (MAPMODE) is a number indicating the type of mapping instruction.

TABLE III

| INSTRUCTION | MAP BYTE DATA FORMAT |
| --- | --- |
| FULL_MAP | (ACTION, TIMESET) |
| NOTIME_MAP | (ACTION1, ACTION0) |
| DRIVE_MAP | (L1[1],L2[1],L1[0],L2[0],TSL[1],TSL[0]) |
| COMPARE_MAP | (L3[1],L4[1],L3[0],L4[0],TSL[1],TSL[0]) |
| DRIVE_NT_MAP | (L1[3],L2[3],L1[2],L2[2],L1[2],L2[1],L1[0],L2[0]) |
| COMP_NT_MAP | (L3[3],L4[3],L3[2],L4[2],L3[2],L4[1],L3[0],L4[0]) |
| DRIVE1_MAP | (L1[7],L1[6],L1[5],L1[4],L1[3],L1[2],L1[1],L1[0]) |
| COMP1_MAP | (L3[7],L3[6],L3[5],L3[4],L3[3],L3[2],L3[1],L3[0]) |

The FULL_MAP instruction (MAPMODE=90) is used when the values of TIMESET and ACTION change randomly from one test cycle to the next. In this mapping mode each MAP_BYTE data byte is of the form (TIMESET, ACTION) and defines a test vector for only a single test cycle (1/1 mapping).

The NOTIME_MAP (MAPMODE=91) instruction is used when the value of TIMESET remains constant from one test cycle to the next but there is no restriction on the manner in which the ACTION code changes. MAP_BYTE bytes following the NOTIME_MAP instruction are of the form (ACTION1,ACTION0) where ACTION0 is the 4-bit action code to be used for the first test cycle after receiving the MAP_BYTE byte and ACTION1 is the 4-bit action code to be used for the second test cycle after receiving the MAP_BYTE byte. Thus in this mapping mode each MAP_BYTE byte defines test vectors for two test cycles. (2/1 mapping).

The DRIVE_MAP instruction (MAPMODE=92) is used when only the values of the lower 2 bits of TIMESET, TS_LOWER, and the lower two bits of ACTION, L1 and L2, change from one test cycle to the next. MAP-BYTE bytes following the DRIVE_MAP instruction are of the form (TSL[1], TSL[0], L1[1], L2[1], L1[0], L2[0])

where TSL[0] and TSL[1] are the lower 2 bits of TIMESET to be used for two successive test cycles MAP_BYTE and where L1[1],L2[1],L1[0],and L2[0] refer to the lower two bits of the ACTION nibble to be used for the two test cycles. Thus in this mapping mode each MAP_BYTE byte defines test vectors for two test cycles (2/1 mapping).

The COMPARE_MAP instruction (MAPMODE=93) is similar to DRIVE_MAP but is used when only the values of the lower 2 bits of TIMESET, TS_LOWER, and the upper two bits of ACTION, L3 and L4, change from one test cycle to the next. In this mapping mode each MAP_BYTE byte defines test vectors for two test cycles (2/1 mapping).

The DRIVE_NT_MAP instruction (MAPMODE=94) is used when only the values of the two lower bits L1 and L2 of ACTION change from one test cycle to the next. In this mode, each MAP_BYTE byte defines test vectors for four test cycles [0] to [3] (4/1 mapping).

The COMPARE_NT_MAP instruction (MAPMODE= 95) is used when only the values of the two upper bits L3 and L4 of ACTION change from one test cycle to the next. In this mode, each MAP_BYTE byte defines test vectors for four test cycles [0] to [3] (4/1 mapping).

The DRIVE1_MAP instruction (MAPMODE=96) is used when only the value of the L1 bit of ACTION changes from one test cycle to the next. In this mode, each MAP_BYTE byte defines test vectors for four test cycles [0] to [7] (8/1 mapping).

COMP1_MAP instruction (MAPMODE=97) is used when only the value of the L3 bit of ACTION changes from one test cycle to the next. In this mode, each MAP_BYTE byte defines test vectors for four test cycles [0] to [7] (8/1 mapping).

Once the instructions have been converted into a sequence of 9-bit MAP_INST and MAP_BYTE bytes, the host computer 22 at step 164D further compresses the data sequence by using a form of looping to repeat sequences of MAP_BYTE bytes. In many applications a particular sequence of MAP_BYTE bytes can be repeated hundreds, thousands or even millions of times, as for example when a node is inactive during most of a test. During the loop compression step 164D, the host computer 22 checks for repetitive sequences of MAP_BYTE bytes and replaces them with loop instructions (LOOP_INST). A LOOP_INST consists of three 9-bit bytes. The first byte is of the form (1,STRINGLEN). The first bit ("1") indicates that the byte is an instruction. If the 8-bit STRINGLEN field is a number between 1 and 32, it indicates that the instruction is a loop instruction (rather than a mapping instruction). The value of STRINGLEN indicates the length of a sequence of MAP_BYTE's to be repeated. The next two 9-bit bytes of the loop instruction indicate the number of times (2 through 32,192) the sequence is to be repeated. Accordingly a three byte loop instruction can replace as many as 32×32,192 MAP_BYTE's. Thus the 9-bit output bytes of the loop compression step 164D can be either of the LOOP_INST, MAP_INST or MAP_BYTE form.

As will be discussed below, the portion of instruction processor 14 which executes the loop instruction to generate a sequence of MAP_BYTE's is limited to performing 32,192 loops. When more loops are required, the sequence produced by loop compression step 164D contains several similar loop instructions (LOOP_INST) in a row. Also various portions of the sequence produced by step 164D may be repeated from time to time. To provide a third level of compression, the sequence output of the loop compression step 164D is compressed at step 164E by replacing such repetitive sequences with high level loop or subroutine call instructions (HIGHL_INST). If the high level compression step 164E sees a recurring pattern in its input sequence, it keeps track of where that pattern is to be stored in the node memory 34. When the pattern reoccurs in the input sequence, step 164E replaces it as appropriate with a high level loop or call instruction referring the instruction processor back to the section of the node memory storing the instruction pattern. This further reduces the amount of node memory needed to store the instructions. Step 164E may also insert high level instructions to provide program control capabilities such as conditional branching.

DECOMPRESSION CIRCUITS

The instruction sequence output of step 164E is a set of algorithms, one for each node, and each algorithm is stored in the appropriate node memory 34. Each algorithm, when executed, seamlessly produces a sequence of test vectors of the form (ACTION, TIMESET) used by the time formatter 38 of FIG. 2 to control timing of its output DRIVE, COMPARE and TRISTATE signals. The instruction processing unit 36 of FIG. 2 executes the algorithm by "undoing" the compression of steps 164A, 164B and 164C, in reverse order. Processing unit 36 includes a high level instruction processor 161 that performs the reverse of the high level compression step 164E. Processor 161 sequentially reads instructions out of the node memory 34 and passes them on to a hardware implemented loop decompressor 162. Whenever processor 161 encounters a high level instruction (HIGHL_INST) it executes it by performing the indicated loop or branch thereby providing a first level of decompression.

The loop decompressor 162 performs the reverse of loop compression step 164D to provide a second level of realtime decompression. As loop decompressor 162 receives MAP_BYTE bytes it passes them on to a vector mapper 163. However, loop decompressor 162 also saves copies of the last 32 MAP_BYTE bytes received from the high level instruction processor 161. When loop decompressor 162 receives a loop instruction (LOOP_INST), it executes the instruction, repeatedly sending up to 32 of the last received MAP_BYTE bytes up to 32,192 times as specified by the loop instruction.

Vector mapper 163 receives the MAP_BYTE bytes from the loop decompressor 162 and map oriented decompresses them to provide the (ACTION, TIMESET) test vectors that control the time formatter 38 of FIG. 2. The loop decompressor 162 assists the vector mapper 163 by decoding the mapping instructions (MAP_INST) and transmitting control signals (MAP_CONT) to vector mapper 163 telling the mapper how to decompress the MAP_BYTE bytes.

Figure 10B:
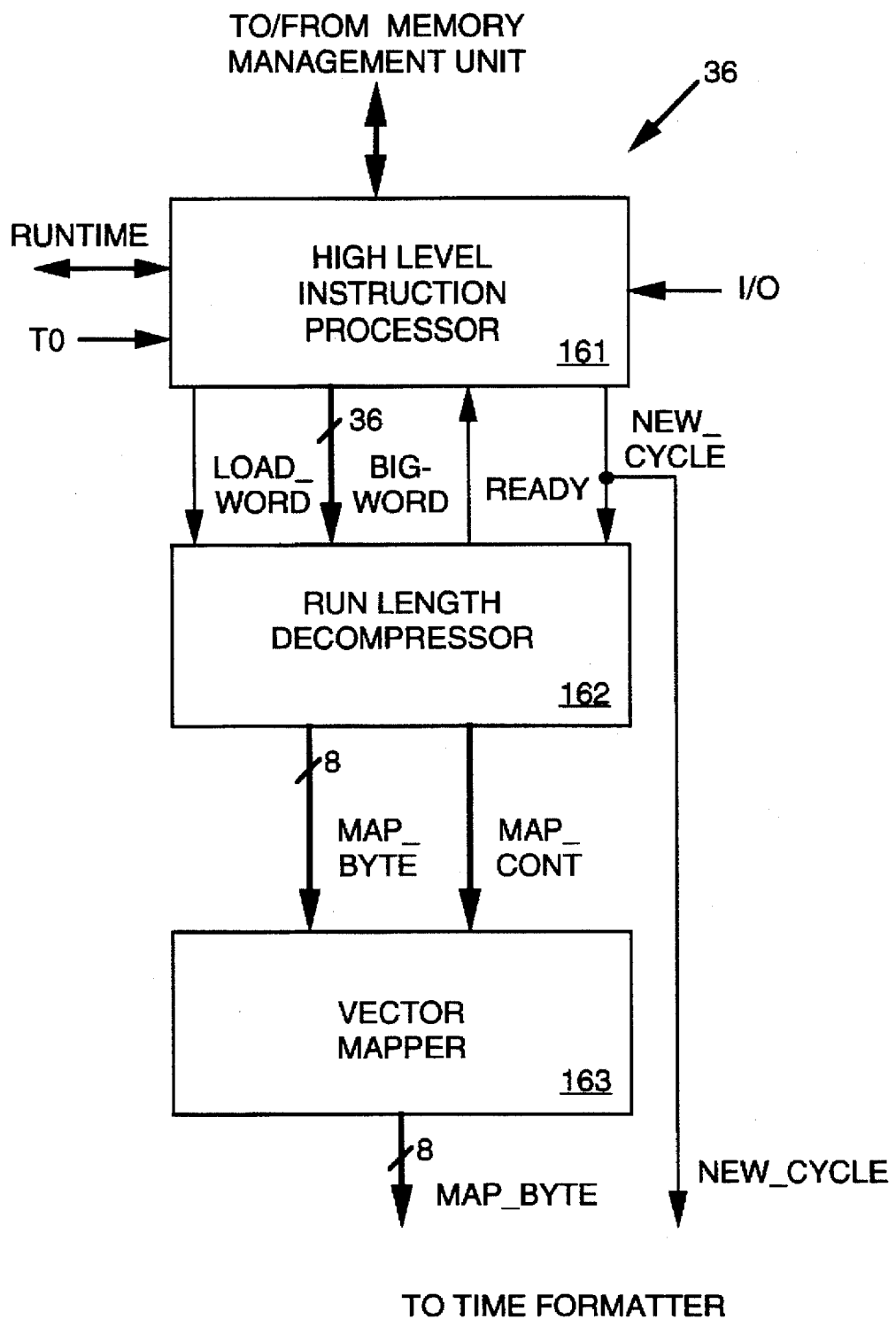
FIG. 10B is a block diagram depicting the instruction processing unit of FIG. 2.

FIG. 10B illustrates the instruction processing unit 36 of FIG. 2 in more detailed block diagram form. Upon receipt of a RUNTIME start signal from the host processor via network interface 30 of FIG. 2, the high level instruction processor 161 begins reading the algorithm out of the node memory 34 via memory management unit 32. As it executes the algorithm it generates a sequence of 9-bit bytes of the form LOOP_INST, MAP_INST, and MAP_BYTE. It packages successive groups of four of these 9-bit bytes into a single 36-bit word (BIGWORD). Whenever decompressor 162 indicates it is ready for more input data via a READY signal, processor 161 pulses a LOAD_WORD signal. This loads a next BIGWORD into the loop decompressor 162. The instruction processor 161 also counts pulses of the T0 timing signal and produces a NEW_CYCLE signal pulse to mark the beginning of a test cycle every K cycles of the T0 signal. The host computer chooses the length of a test cycle before the test begins by sending data to processor 161 via I/O control unit 44 of FIG. 2.

Loop decompressor 162 receives the 36-bit BIGWORD, decomposes it into its four component 9-bit bytes, and processes each 9-bit byte in succession, executing the MAP_INST and LOOP_INST instructions to produce a sequence of MAP_BYTE bytes forwarded to vector mapper 163. As discussed above, a MAP_BYTE conveys sufficient information to allow vector mapper 163 to produce 1, 2, 4 or 8 (ACTION, TIMESET) test vectors and it has to produce one such vector for each test cycle. Therefore decompressor 162 transmits a new MAP_BYTE byte to vector mapper 163 every 1,2,4 or 8 pulses of the NEW_CYCLE signal, depending on the mapping mode indicated by the last received mapping instruction (MAP_INST). It also decodes MAP_INST mapping instructions and produces mapping control signals (MAP_CONT) telling mapper 163 how to decompress its current MAP_WORD output.

SEAMLESS DECOMPRESSION

Decompresser 162 and vector mapper 163 work together to produce an output vector on each cycle of the NEW_CYCLE signal and do so "seamlessly", without interruption, despite the fact that decompresser 162 can forward no more than one MAP_BYTE to vector mapper 163 during any cycle of the NEW_CYCLE signal and cannot provide vector mapper 163 with a MAP_BYTE during every cycle. During some cycles of the NEW_CYCLE signal, decompresser 162 receives and decodes MAP_CONT instructions, and during those cycles decompresser 162 cannot transmit a MAP_BYTE to vector mapper 163. Since vector mapper 163 must produce a vector during every cycle of the NEW_CYCLE signal, one might think that the cycle required to receive and decode a MAP_CONT instruction would cause an interruption in the vector mapper's flow of output vectors. However the manner in which MAP_CONT instructions are intermixed with MAP_BYTEs resolves the problem so as to provide for seamless decompression.

A MAP_CONT instruction may indicate that the vector mapper 163 is expected to change from 1:1 mapping (i.e. mapper receives one new MAP_BYTE byte for every pulse of the NEW_CYCLE signal) to 1:N mapping (1 MAP_BYTE byte for every N pulses of the NEW_CYCLE signal, for N=2, 4 or 8). In such case, the MAP_CONT instruction is inserted into the data sequence sent to decompresser 162 immediately after the first 1:N MAP_BYTE byte. Decompresser 162 then receives and decodes the MAP_CONT instruction during the next NEW_CYCLE signal cycle. The transition from 1:1 to 1:N mapping thus becomes "seamless"—without interruption to test vector flow due to the extra NEW_CYCLE signal needed—because decompresser 162 uses a "spare" cycle of the NEW_CYCLE signal to decode the instruction. That cycle is "spare" because the preceding MAP_BYTE includes sufficient information to keep mapper 163 busy for N cycles, and mapper 163 does not require any further MAP_BYTE inputs for the next N−1 cycles.

Conversely a MAP_CONT instruction may indicate that the vector mapper 163 is expected to change from 1:N mapping to 1:1 mapping. In this case, the MAP_CONT instruction is inserted into the data sequence sent to decompresser 162 immediately before the first 1:1 MAP_BYTE byte. Decompresser 162 thus receives and decodes the MAP_CONT instruction during a spare cycle in which it need not send a MAP_BYTE to the vector mapper 163, currently in the last cycle of preceding 1:N mapped MAP_BYTE byte. Thus the transition from 1:N to 1:1 mapping also becomes "seamless".

Figure 10C:
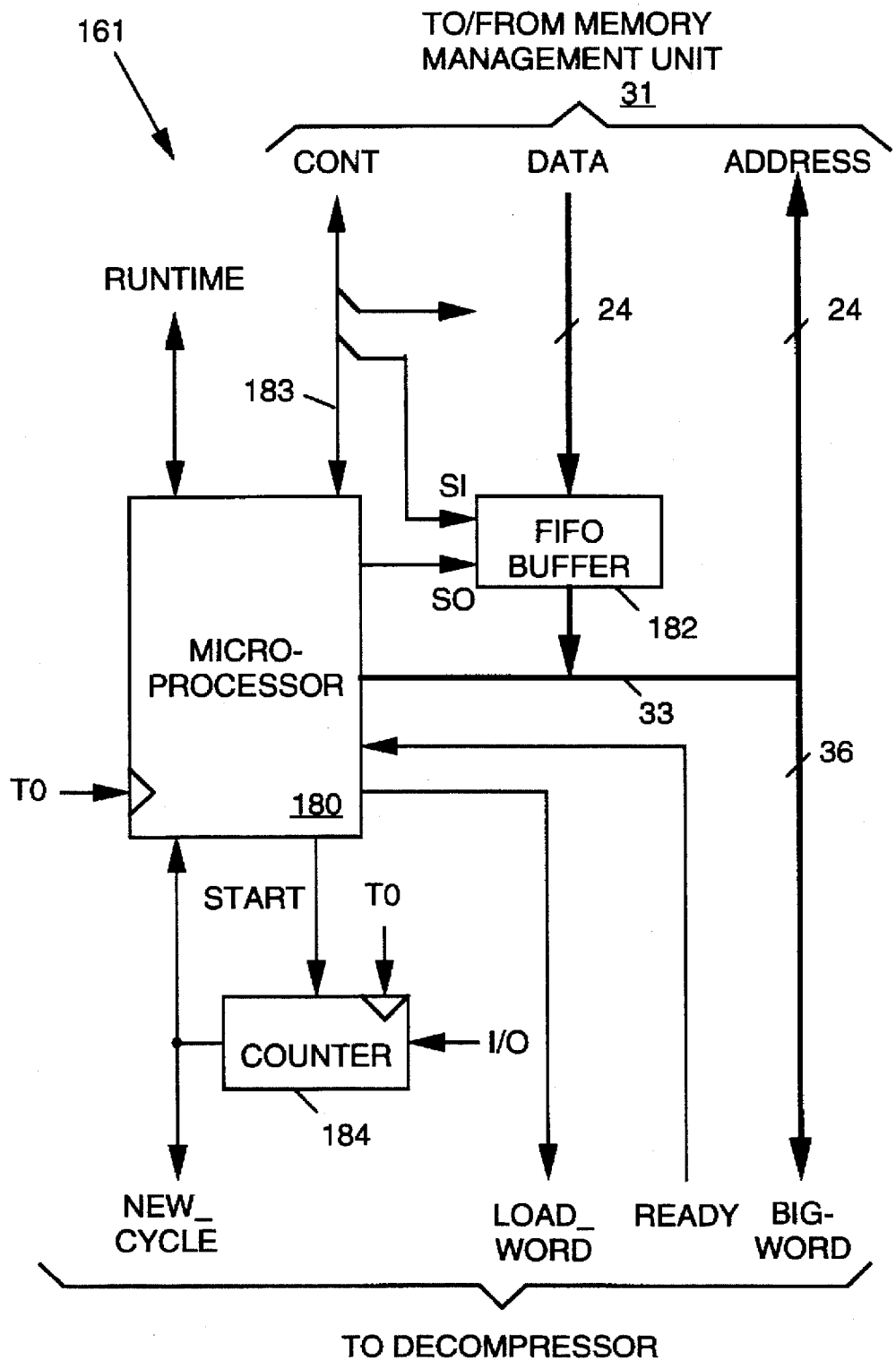
FIG. 10C is a block diagram depicting the high level instruction processor of FIG. 10B.

FIG. 10C illustrates the high level instruction processor 161 of FIG. 10B in more detailed block diagram form. Instruction processor unit 161 includes a microprocessor 180 which executes instructions conveyed on local bus 31 from memory 34 of FIG. 2 via memory management unit 32. When microprocessor 180 sends a starting address to memory management unit 32 of FIG. 2 via bus 31 and signals memory management unit 32 via control lines 183, memory management unit 32 responds by reading 9-bit instructions out of memory 34 of FIG. 2 starting at the indicated address. Memory management unit 32 loads the instructions into a first-in/first-out (FIFO) buffer 182 by asserting a shift in control signal SI on control lines 183. Memory management unit 32 of FIG. 2 continues to read 9-bit data bytes out of successive addresses of memory 34 and to shift them into FIFO buffer 182 until the FIFO buffer is full. Memory management unit 32 then signals microprocessor 180 via control lines 183 telling it that instructions are available in FIFO buffer 182. Microprocessor 180 sequentially generates a shift out signal SO causing FIFO buffer 182 to shift out a next instruction onto bus 33. Microprocessor 180 then reads and executes the instruction appearing on bus 33. Whenever FIFO buffer 182 is depleted of instructions, microprocessor 180 sends another address to the memory management unit 32 of FIG. 2 and the memory management unit reloads the FIFO buffer with a next set of instructions.

Microprocessor 180 can assert any of four RUNTIME output signals, each being sent to a separate one of the four network interfaces 30 of FIG. 2. Microprocessor 180 can also receive any of four RUNTIME input signals, one from each network interface 30. The output RUNTIME signals permit microprocessor 180 to signal the host computer or other nodes during a test operation when instructed to do so, for example to indicate test completion. The input RUNTIME signals allow the host computer or other nodes to signal microprocessor 180 during a test, for example to mark the beginning or end of a test or to tell microprocessor 180 to execute an interrupt routine.

Before a test operation begins, the host processor, via I/O circuit 44 of FIG. 2 stores a data value in a counter 184 within instruction processing unit 36 indicating the length of each test cycle in terms of a number of T0 signal cycles. It tells microprocessor 180 to begin executing instructions via a RUNTIME SIGNAL. The first instruction tells the microprocessor to send a START signal to counter 184 to tell it to begin counting T0 signal cycles. As it executes instructions, it microprocessor 180 produces a sequence of 9-bit MAP_BYTE, MAP_INST and LOOP_INST bytes and assembles groups of four into the 36-bit BIGWORD word to be sent to the decompressor. Microprocessor 180 sends BIGWORD to the decompressor by asserting the LOAD_WORD signal on the first NEW_CYCLE pulse generated after the decompressor asserts the READY signal. Microprocessor 180 then assembles a next BIGWORD and rests until it receives another NEWCYCLE signal pulse from counter 184 indicating the start of a new test cycle. At the end of a test operation, a last instruction may tell microprocessor 180 to assert an output RUNTIME signal indicating test completion. Network interface 30 of FIG. 2 can be configured to forward that signal to the host processor or other nodes as appropriate.

Figure 10D:
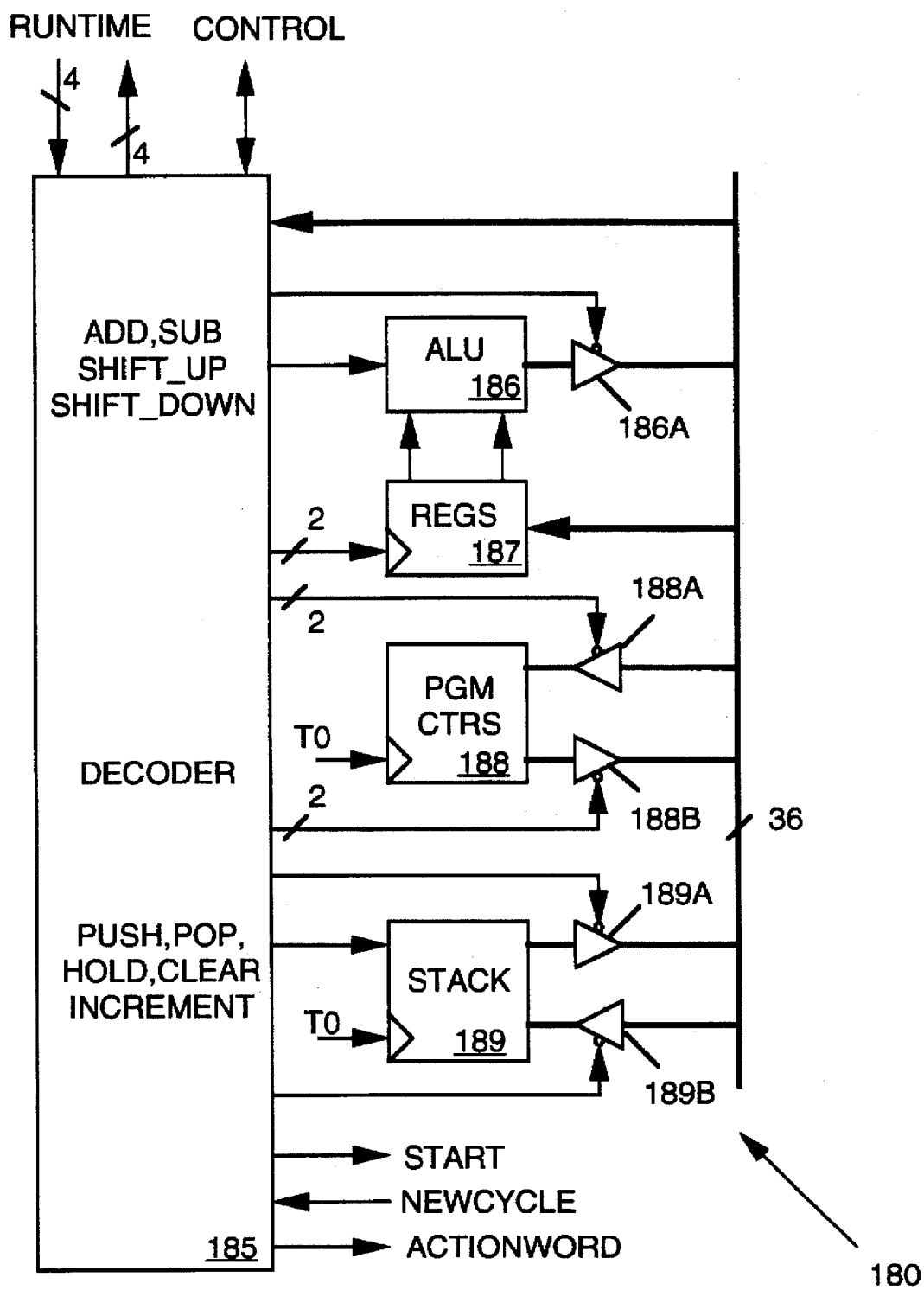
FIG. 10D is a block diagram depicting the microprocessor of FIG. 10C.

FIG. 10D is a block diagram illustrating a suitable architecture for microprocessor 180 of FIG. 10C. The primary function of microprocessor 180 is to execute algorithmic instructions including adding, subtracting, and bit shifting, and utilizing subroutines, recursion, branching and other well-known algorithmic techniques so as to produce test vector sequences. Those skilled in the art will appreciate that a number of well-known microprocessor architectures may implement such functions. In the preferred embodiment, microprocessor 180 includes instruction decoder 185, an arithmetic logic unit (ALU) 186, a pair of registers 187, a pair of program counters 188 and stack circuitry 189. Instruction decoder 185 decodes 24-bit instructions on bus 33 to produce several control output bits. Some of these bits control loading of data into registers 187 and select operations to be performed by ALU 186. ALU 186 has an output selectively coupled to bus 33 via a tristate buffer 186A controlled by decoder 185. ALU 186 has two inputs, each connected for receiving data stored in a separate one of the two registers 187. Registers 187 receive and store data appearing on bus 33 when input enabled by signals from decoder 185. ALU 186 can produce an output that is selectively either the sum of or difference between the two values stored in registers 187, or which is a bit-shifted (multiplied by 2 or divide by 2) version of a value stored in either register. Program counters 188 have outputs coupled to bus 33 through tristate buffers 188A and inputs coupled to bus 33 through tristate buffers 188B. Buffers 188A and 188B are controlled by signals from decoder 185. Counters 188 are useful for keeping track of instruction addresses. Stack circuits 189 controlled by decoder 185, have outputs receiving addresses on bus 33 via tristate buffers 189A and inputs for placing addresses on bus 33 via 189B via tristate buffers 189B. Stack circuits 189 include program counters, stack registers and other circuitry operating in a well-known manner to push, pop, clear, hold or increment subroutine return addresses under decoder 185 control.

Figure 10E:
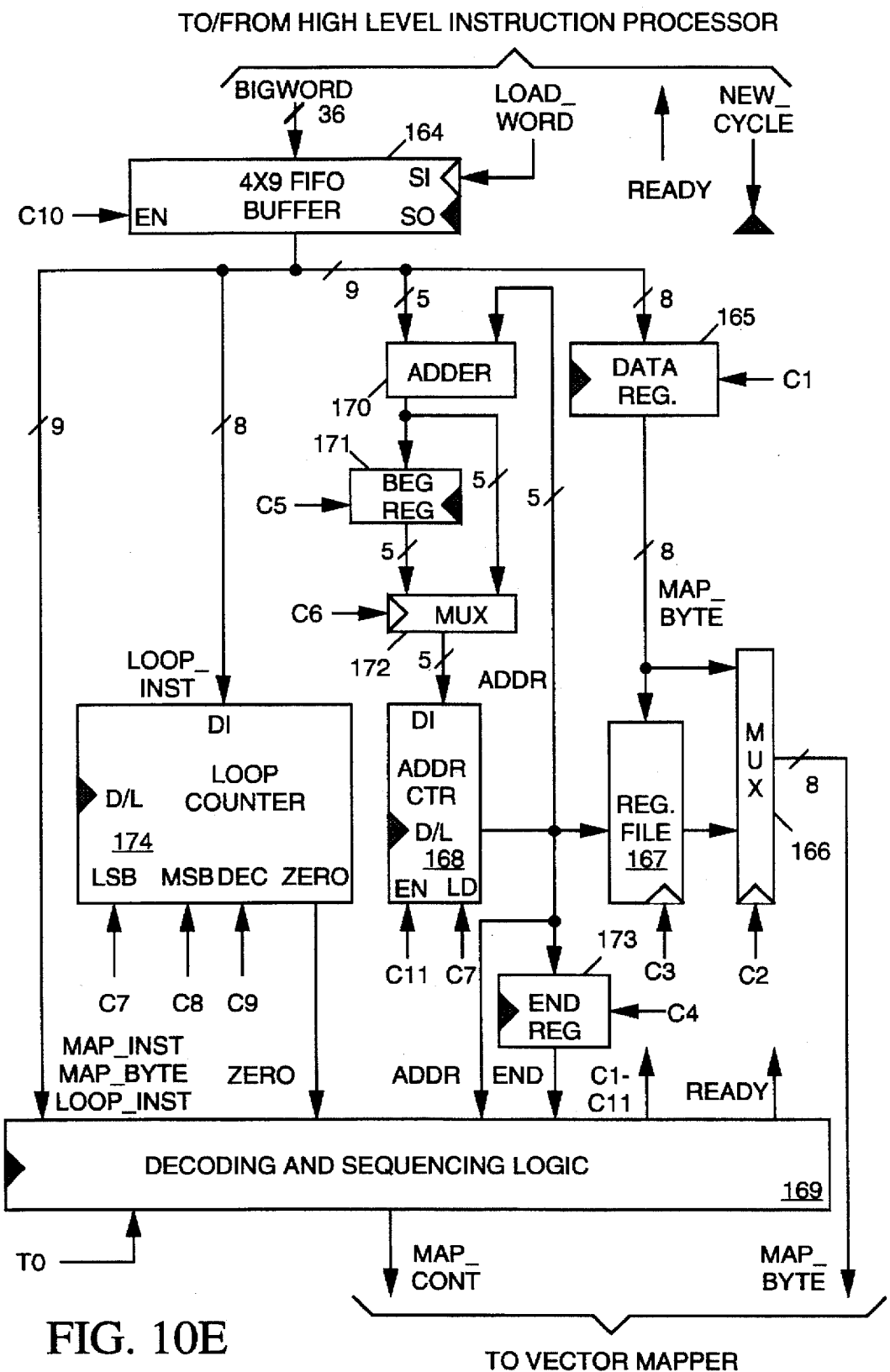
FIG. 10E is a block diagram depicting the loop decompressor of FIG. 10B.

FIG. 10E illustrates the loop decompressor 162 of FIG. 10B in more detailed block diagram form. Decompressor 162 receives and stores the 36-bit BIGWORD in a 4×9 FIFO buffer 164, controlling its input strobe with the LOAD_WORD signal. When output enabled by a control signal C10, FIFO buffer 164 shifts out four 9-bit bytes in sequence in response to successive NEW_CYCLE signal pulses. If the current 9-bit output byte from buffer 161 is a MAP_BYTE byte, the NEW_CYCLE signal also tells a register 165 to store the 8 least significant bits of the MAP_BYTE byte. The MAP_BYTE byte stored in register 165 is forwarded via a multiplexer 166 to the vector mapper 163 of FIG. 10B. The MAP_BYTE is also loaded into in an addressable register file 167. Register file 167 has 32 addresses and always stores at successive addresses the last 32 MAP_BYTE bytes sent to the vector mapper. When enabled by a control signal C11, an address counter 168 decrements the current address of register file 167 at which MAP_BYTE is stored upon each pulse of the NEW_CYCLE signal. When the address reaches 0 it resets to 31.

If the current output byte of FIFO buffer 164 is a mapping instruction (MAP_INST), it is decoded by decoding and sequencing logic circuit 169 which produces the MAP_CONT signals controlling how the vector mapper decodes subsequent MAP_BYTE bytes. Logic circuit 169 also produces the C10 signal which enables the FIFO buffer 164 shift out and the C11 signal that count enables counter 168. Logic circuit 169 enables buffer 164 after every 1, 2, 4 or 8 NEW_CYCLE pulses depending on the mapping mode indicted by the last sent mapping instruction. Logic circuit 169 keeps track of the number of 9-bit bytes shifted out of buffer 164 and sends the READY signal to the high level instruction processor whenever buffer 164 is emptied.

When the 9-bit byte shifted out of buffer 164 is a loop instruction (LOOP_INST) logic circuit 169 responds by pulsing a C5 control signal that causes the current address output (ADDR) of adder 170 to be stored in a register 171. The last eight bits of LOOP_INST output of buffer 164 indicate the length of a sequence of MAP_BYTE bytes stored in register file 167 that is to be repeated. An adder 170 adds that length to the current register file 167 address (ADDR) to produce a beginning address for the loop. Logic circuit 169 generates a C5 control signal which loads that beginning address into a register 171 and sets a C6 signal to switch a multiplexer 172 to route the starting address from adder 170 to a data input (DI) of address counter 168. Logic circuit then strobes a signal C7 causing counter 168 to load in the beginning address. In the meantime, logic circuit 169 switches multiplexer 166 to pass the currently addressed MAP_BYTE byte stored in register file 167 to the vector mapper.

On the next two NEW_CYCLE pulses after receiving the first byte of the loop instruction, logic circuit 169 pulses C7 and C8 control signals causing a loop counter 174 to load first the 8 least significant bits (LSB's) of the next two 9-bit output bytes of buffer 164. These two bytes convey the number (2–32,129) of loop cycles to perform.

Thereafter, whenever a new MAP_BYTE is to be sent to the vector mapper, logic circuit 169 asserts the C11 signal to allow counter 160 to decrement the current address on receipt of the next NEW_CYCLE, thereby forwarding the MAP_BYTE stored in the next register address to the vector mapper. Whenever the current address output (ADDR) of address counter 168 matches the loop ending address (END) stored in register 173, logic circuit 169 determines that the decompressor has reached the end of a loop. In such event, logic circuit 169 asserts a C9 signal which allows the loop counter 174 to decrement its count on receipt of the next NEW_CYCLE pulse. Logic circuit 169 also uses a C6 signal to switch multiplexer 172 so that it delivers the register file address of the first byte of the loop stored in register 171 to the data input of address counter 168. Logic circuit 169 also asserts the C7 signal so that the beginning address is loaded into counter 168 on the next NEW_CYCLE pulse. This causes register file 167 to send the first MAP_BYTE of the next loop to the vector mapper.

When the count of loop counter 174 reaches zero, indicating that the decoder has started a loop, it asserts a ZERO signal sent to logic circuit 169. Thereafter, when logic circuit 169 finds that the current address (ADDR) matches the loop ending address (END) it determines that the loop instruction has been fully executed. Logic circuit 169 then waits until it has determined that the vector mapper has decompressed the last MAP_BYTE of the loop, and then enables FIFO buffer 164 so that it can shift out a next 9-bit MAP_INST instruction or MAP_BYTE byte.

Figure 10F:
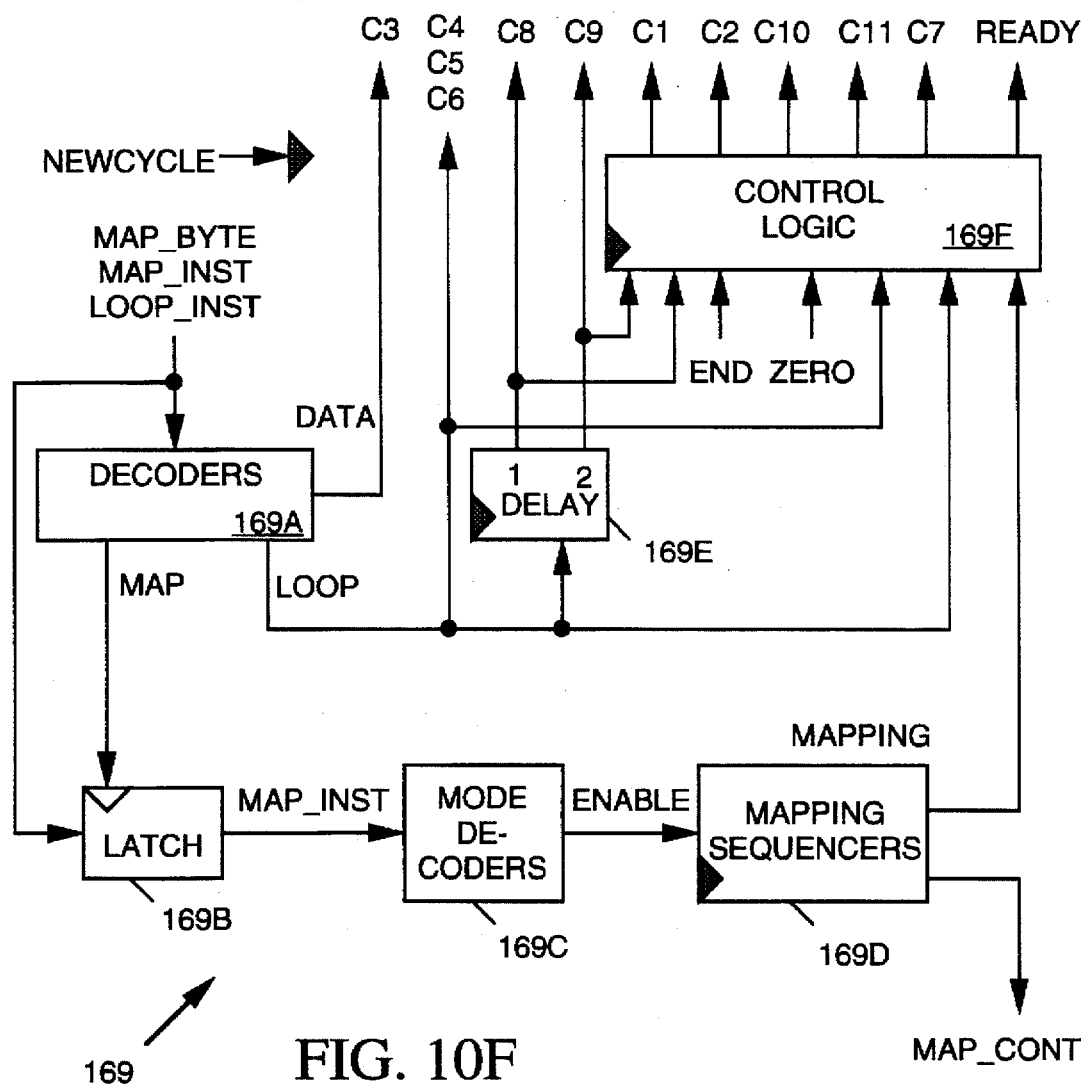
FIG. 10F is a block diagram depicting the decoding and sequencing logic of FIG.10E.

FIG. 10F illustrates decoding and sequencing logic circuit 169 of FIG. 10E in more detailed block diagram form. Circuit 169 includes a set of decoders 169A which receive the 9-bit MAP_INST or MAP_BYTE from buffer 164 of FIG. 10E and assert a MAP signal if it is a mapping instruction, a LOOP signal if it is a loop instruction, or a DATA signal if it is a MAP_BYTE. DATA is sent out as the C3 signals. C3 input enables register file 167 of FIG. 10E. If the incoming byte is a mapping instruction, decoders 169A assert the MAP signal causing a latch 169B to latch the MAP_INST instruction onto a set of decoders 169C. These decoders ascertain the mapping mode and select one of a set of map control sequencers 169D. The selected sequencer 169D produces the MAP_CONTR signals controlling the vector mapper 163 of FIG. 10B. The selected sequencer 169D drives the MAP_CONT signals high or low on each pulse of the NEW_CYCLE signal as necessary to produce a desired MAP_CONT signal patterns. While the vector mapper is decoding a MAP_BYTE, which may require from 1 to 8 test cycles, the selected sequencer 169D asserts a MAPPING signal. The MAPPING signal indicates that the vector mapper is busy and should not receive another MAP_BYTE byte. On every 1, 2, 4 or 8 NEW_CYCLE pulses (depending on the current mapping mode) the selected sequencer 169D deasserts the MAPPING signal pulse to indicate that the vector mapper requires a next MAP_BYTE.

When decoder 169A determines that WORD is a loop instruction, it asserts the LOOP signal for one cycle of the T0 signal. The LOOP signal is delivered as the C4, C5, and C6 control signals to register 173, register 171, and multiplexer 172 of FIG. 10E. The LOOP signal also tells an address counter load circuit 169F to assert the C7 signal which loads the starting address of the loop into counter 168 of FIG. 10E. A delay circuit 169E responds to the LOOP signal by pulsing the C8 and C9 signals on the next two NEW_CYCLE signal pulses, respectively, thereby loading the two successive bytes of the loop count number into the loop counter 174 of FIG. 10E.

The C8, C9, END, ZERO and NEXT_BYTE signals are supplied as input to a control logic circuit 169F which produces the C1, C2, C7, C10, C11 and READY signals. Logic circuit 169F asserts C1, the signal that input enables the data register 165 of FIG. 10E whenever a MAP_BYTE byte appears at the output of buffer 164, unless the MAPPING signal is asserted, indicating that the vector mapper is busy.

Logic circuit 169F asserts C10 each time a byte is to be shifted out of the FIFO buffer 164 of FIG. 10E, or on each pulse of the NEW_CYCLE signal unless inhibited from doing so by an input signal. The MAPPING signal inhibits C10 when the vector mapper is decompressing a MAP_BYTE. On receipt of the LOOP signal, indicating the decompressor has received the first byte of a loop instruction, circuit 169F asserts the C10 only for the next two NEW_CYCLE pulses so as to obtain the second two bytes of the loop instruction. Thereafter, while the ZERO signal is deasserted, circuit 169F inhibits the C10 signal to prevent data from being read out of FIFO buffer 164 of FIG. 10E. After the ZERO signal is asserted, indicating the decompressor has begun a last cycle of a loop, circuit 169F continues to inhibit the C10 signal until both the MAPPING and END signals have been is asserted. END indicates the end of the last loop has been reached and MAPPING indicates (when deasserted) that the vector mapper has decompressed the last MAP_BYTE of the last loop. Thereafter the C10 signal is asserted to enable the FIFO buffer to provide the decompressor with a new instruction or MAP_BYTE.

Logic circuit 169F also counts NEW_CYCLE signal pulses occurring while C10 is asserted to determine how many of the bytes in the FIFO buffer have been shifted out. Circuit 169F asserts the READY signal after every four such NEW_CYCLE pulses to indicate to the high level instruction processor 161 of FIG. 10B that FIFO buffer 164 is empty.

Logic circuit 169F also produces the C11 signal count enabling counter 168 and the C2 signal controlling multiplexer 166 of FIG. 10E. C11 is asserted whenever a new byte is to be sent to the vector mapper as indicated by the MAPPING signal. C2 is asserted route MAP_BYTE data from register 165 unless a LOOP_INST instruction is being executed. Logic circuit 169F deasserts C2 after ZERO is deasserted. At the completion of the loop instruction, after ZERO has been asserted once again, and after END is asserted, control circuit 169F asserts C2 to switch multiplexer 166 to forwarding data from register 165.

Logic circuit 169F asserts C7, the signal that load loop beginning addresses into counter 168 of FIG. 10E when the LOOP signal indicates a LOOP_INST instruction has been received. It thereafter asserts C7 when the END signal indicates the end of a LOOP has been reached and continues to do so until the ZERO signal indicates that the system has completed executing the loop instruction.

Figure 10G:
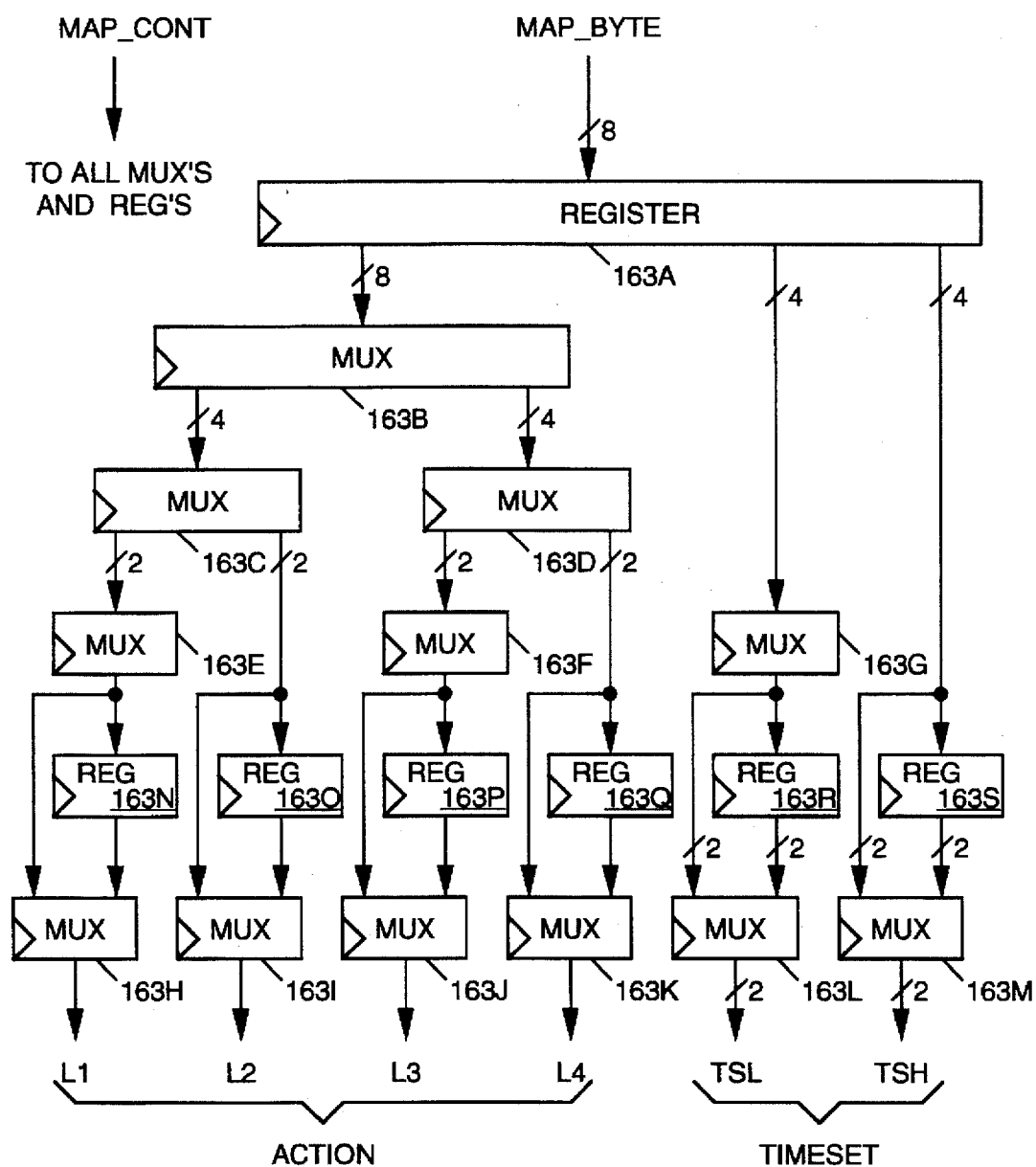
FIG. 10G is a block diagram depicting the vector mapper of FIG. 10B.

FIG. 10G illustrates the vector mapper circuit 163 of FIG. 10B in more detailed block diagram form. Mapper circuit 163 includes a register 163A for storing the 8-bit MAP_BYTE data from the loop decompressor 162 of FIG. 10B. A set of multiplexers 163B–163M controlled by the MAP_CONT signals from loop decompressor 162 control how the MAP_BYTE bits stored in register 163A are routed into the output (ACTION,TIMESET) test vector. In the FULL_MAP mapping mode (see Table III above), a new MAP_BYTE byte is loaded into register 163A every test cycle and all 8-bits of the MAP_BYTE are mapped directly into corresponding bits of the (ACTION,TIMESET) vector. At the same time, each bit of the MAP_BYTE byte is stored in a separate one of registers 163N-163S. In the NOTIME_MAP mode, the value of TIMESET remains constant from one test cycle to the next but there is no restriction on the manner in which the ACTION code changes. In this mode the four bits last stored in registers 163R and 163S immediately before the start of the NOTIME_MAP mode remain unchanged and multiplexer 163L and 163M are switched to pass those four bits onward as the TIMESET nibble. The MAP_BYTE byte stored in register 163A is of the form (ACTION1,ACTION0). During a first test cycle, multiplexers 163B-163F and 163H-163K are switched to pass the 4-bit ACTION0 code onwards as the ACTION nibble. During a second test cycle, these multiplexers are switched to pass the ACTION1 nibble onward as the ACTION nibble.

The DRIVE_MAP mode is used when only the values of the lower 2 bits of TIMESET, TSL, and the lower two bits of ACTION, L1 and L2, change from one test cycle to the next. MAP_BYTE bytes following the DRIVE_MAP instruction are of the form (TSL[1],TSL[0],L1[1],L2[1],L1[0],L2[0]) where TSL[0] and TSL[1] are the lower 2 bits of TIMESET to be used for the current and next test cycles after receiving MAP_BYTE and where L1[1],L2[1],L1[0] ,and L2[0] refer to the lower two bits of the ACTION nibble to be used for the current and next test cycles after receiving MAP_BYTE. During a first test cycle, data last stored in register 163S prior to entering the DRIVE_MAP mode is forwarded as the upper two bits TSH of TIMESET and data stored in registers 163P and 163Q are forwarded as bits L3 and L4 of ACTION. During a first test cycle, multiplexers 163A-163M are switched to provide TSL[0] as the TSL bits of TIMESET and to provide L1[0] and L2[0] as the L1 and L2 bits of ACTION. During a next test cycle, multiplexers 163A-163M are switched to provide TSL[1] as the TSL bits of TIMESET and to provide L1[1] and L2[1] as the L1 and L2 bits of ACTION.

The COMPARE_MAP mode is used when only the values of the lower 2 bits of TIMESET, TSL, and the upper two bits of ACTION, L3 and L4, change from one test cycle to the next. MAP_BYTE bytes following the DRIVE_MAP instruction are of the form (L3[1],L4[1],L3[0],L4[0], TSL[1],TSL[0]) where TSL[0] and TSL[1] are the lower 2 bits of TIMESET to be used for the current and next test cycles after receiving MAP_BYTE and where L3[11], L4[1], L3[0], and L4[0] refer to the upper two bits of the ACTION nibble to be used for the current and next test cycles after receiving MAP_BYTE. During a first test cycle, data last stored in register 163R before entering the COMPARE_MAP mode is forwarded as the lower two bits TSL of TIMESET and data stored in registers 163P and 163Q are forwarded as bits L3 and L4 of ACTION. During a first test cycle, multiplexers 163A-163M are switched to provide TSL[0] as the TSL bits of TIMESET and to provide L3[0] and L4[0] as the L3 and L4 bits of ACTION. During a next test cycle, multiplexers 163A-163M are switched to provide TSL[1] as the TSL bits of TIMESET and to provide L3[1] and L4[1] as the L3 and L5 bits of ACTION.

The DRIVE_NT_MAP mode is used when only the values of L1 and L2 of the (ACTION, TIMESET) vector change from one test cycle to the next. MAP_BYTE bytes following the DRIVE_MAP instruction are of the form (L1[3],L2[3],L1[2],L2[2],L1[2], L2[1],L1[0],L2[0]) where L1(n) and L2(n) refer to the bits to be forwarded as the L1 and L2 bits of ACTION for the nth test cycle after receiving MAP_BYTE in register 163A. All other bits of the (ACTION, TIMESET) test vector are provided from registers 163P-163S containing data last stored in register 163A prior to entering the DRIVE_NT_MAP mode is forwarded as the lower two bits TSL of TIMESET and data stored in registers 163P and 163Q are forwarded as bits L3 and L4 of ACTION.

The COMP_NT_MAP mode is used when only the values of L3 and L4 of the (ACTION,TIMESET) byte change from one test cycle to the next. MAP_BYTE bytes following the DRIVE_MAP instruction are of the form (L3[3],L4[3],L3[2],L4[2],L2[2], L4[1],L2[0],L4[0]) where L3(n) and L4(n) refer to the bits to be forwarded as the L3 and L4 bits of ACTION for the nth test cycle after receiving MAP_BYTE in register 163A. All other bits of (ACTION, TIMESET) are provided from registers 163N, 163O, 163R and 163S containing data last stored in register 163A prior to entering the COMP_NT_MAP mode is forwarded as the lower two bits TSL of TIMESET and data stored in registers 163P and 163Q are forwarded as bits L3 and L4 of ACTION.

The DRIVE1_MAP mode is used when only the value of L1 of (ACTION, TIMESET) changes from one test cycle to the next. MAP_BYTE bytes following the DRIVE_MAP instruction are of the form (L1[7],L1[6],L1[5],L1[4],L1[3] ,L1[2],L1[1],L1[0]) where L1(n) refers to the bit to be forwarded as the L1 bit of ACTION for the nth test cycles after receiving MAP_BYTE in register 163A. All other bits of (ACTION, TIMESET) are provided from registers 163O-163S containing data last stored in register 163A prior to entering the DRIVE1_MAP mode.

The COMP1_MAP mode is used when only the value of L3 of (ACTION, TIMESET) changes from one test cycle to the next. MAP_BYTE bytes following the DRIVE_MAP instruction are of the form (L3[7],L3[6],L3[5],L3[4],L3[3] ,L3[2],L3[1],L3[0]) where L3(n) refers to the bit to be forwarded as the L3 bit of ACTION for the nth test cycles after receiving MAP_BYTE in register 163A. All other bits of the (ACTION, TIMESET) test vector are provided from registers 163N and 163P-163S containing data last stored in register 163A prior to entering the COMP1_MAP mode.

COMPRESSION ALGORITHM

Figure 10H:
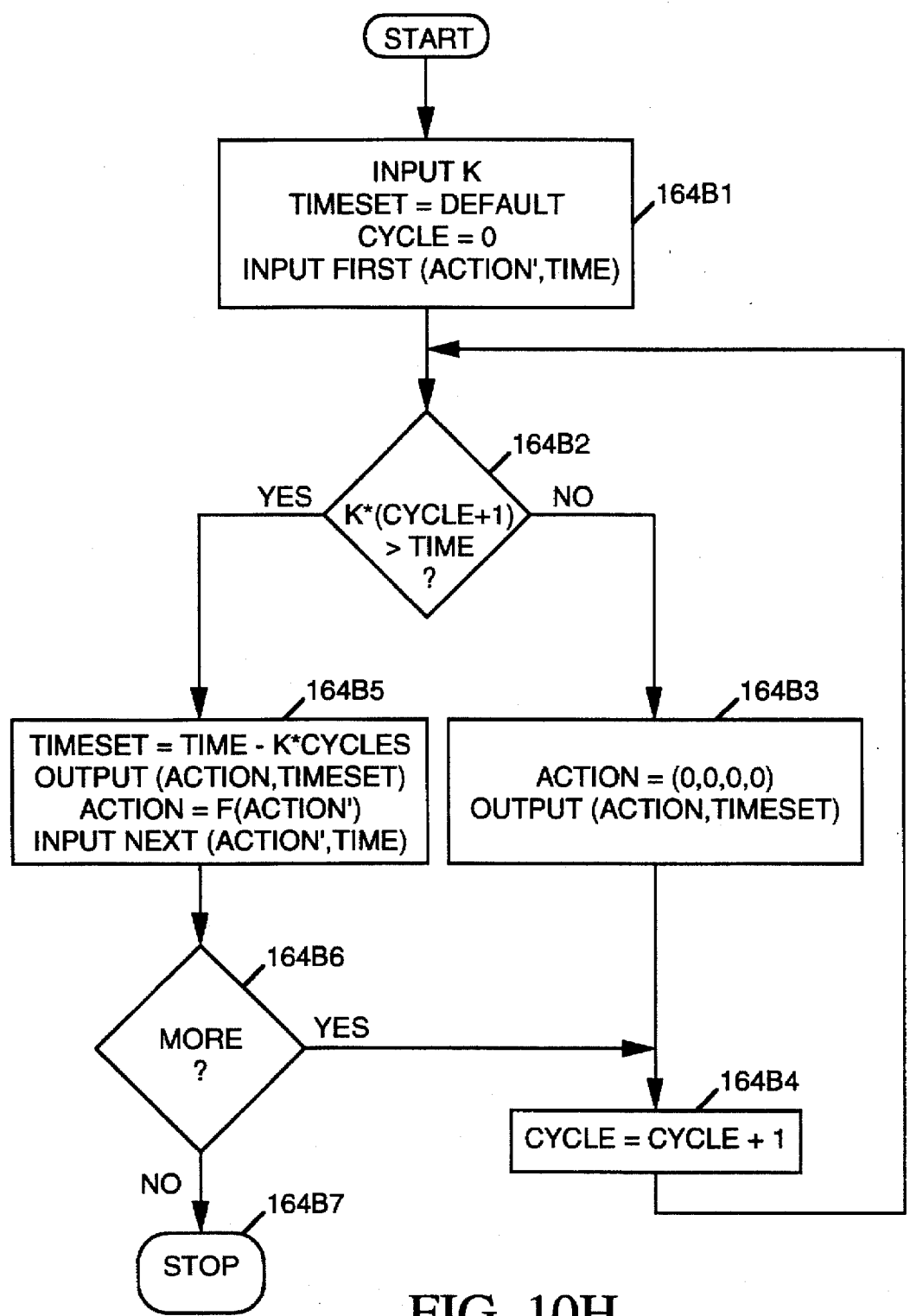
FIG. 10H is a flow chart illustrating the test cycle conversion step of FIG. 10A.

FIG. 10H is a flow chart illustrating the test cycle conversion step 164B of FIG. 10A. The host computer executes this step to convert an input HDL data sequence description of a test having items of the form (ACTION',TIME) to an output (ACTION, TIMESET) test vector sequence. At step 164B1 the host computer receives as input the value K' (the length of time of each test cycle). The host computer initializes the TIMESET nibble to (0,0,0,0), initializes a cycle counter CYCLE to zero, and gets a first item (ACTION',TIME) of the input sequence. At step 164B2 the host computer determines whether the time (TIME) indicated by the first byte of the input sequence is less than K*(CYCLE+1). CYCLE indicates a number of test cycles. The product (K'*CYCLE) indicates a total time since the start of a test. If the time indicated by TIME is not less than K*(CYCLE+1), then ACTION' is to be carried out during a test cycle number later than CYCLE. In such case the host computer (step 164B3) sets an ACTION nibble to (0,0,0,0) outputs a next vector (ACTION, TIMESET) of the output sequence using the current value of ACTION (0,0,0,0) and the last selected value of TIMESET. The host computer then increments CYCLE (step 164B4) and returns to step 164B2. If at step 164B2 the time indicated by TIME is less than K*(CYCLE+1), then the host computer (at step 164B5) determines a new value for TIMESET. TIMESET is a nibble indicating a time during the current cycle that ACTION' is to occur and indicates the difference between the time indicated by TIME and the time at the start of the current cycle (K*CYCLE). The host computer has sixteen TIMESET values to choose from and selects the value for TIMESET that best represents (TIME−K*CYCLE). The host computer then outputs a next (ACTION, TIMESET) byte of the sequence, determining the value of ACTION by encoding the ACTION' portion of the input (ACTION', TIME) item. The host computer then gets the next (ACTION',TIME) item, if any, from the input sequence. If the input sequence is not at an end (step 164B6) the host computer increments CYCLE (step 164B4) and returns to step 164B2. The routine continues to generate output (ACTION, TIME) bytes until the host computer determines it has reached the end of the input sequence at step 164B6. The routine then ends at step 164B7.

Figure 10I:
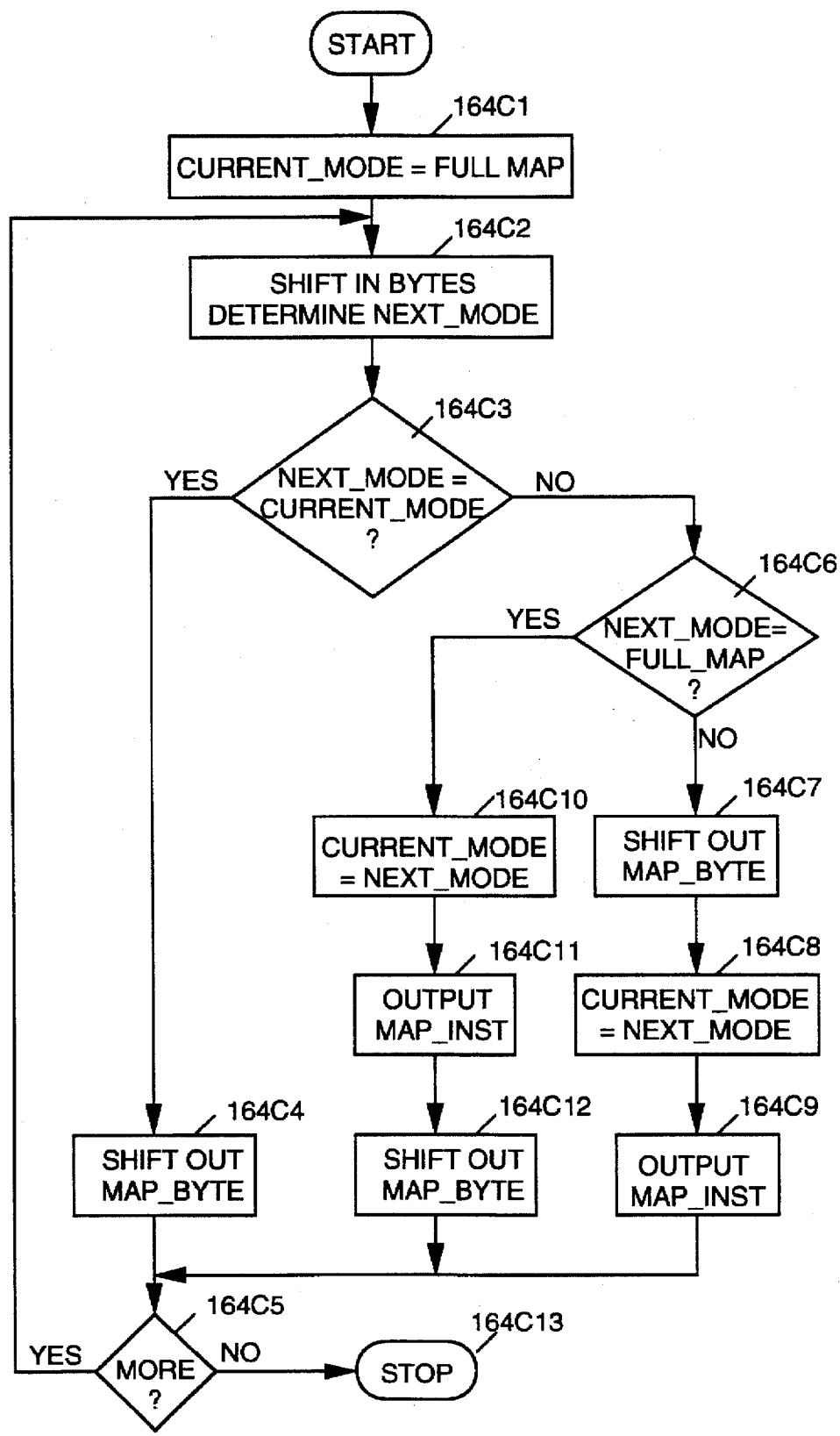
FIG. 10I is a flow chart illustrating the mapping compression step of FIG. 10A.

FIG. 10I is a flow chart illustrating the mapping compression step of FIG. 10A. In this step the host computer converts a sequence of (ACTION, TIMESET) test vectors into a sequence of MAP_INS and MAP_BYTE bytes. Initially (step 164C1) the host computer sets a CURRENT_MODE parameter to "FULL_MAP". Then at step 164C2, it reads in a block of eight (ACTION, TIMESET) vectors and determines a next mapping mode (NEXT_MODE) for most efficiently mapping the first 1, 2, 4, or 8 bytes of the block. If the next mapping mode is the same as the current mapping mode (step 164C3), then the 1, 2, 4 or 8 bytes to be mapped are replaced with an appropriate MAP_BYTE (step 164C4) which is then provided as the next byte of the output sequence. If there are more unmapped (ACTION, TIMESET) vectors in the input sequence (step 164C5) then the host computer returns to step 164C2, acquires more (ACTION, TIMESET) vectors and determines the next mapping mode. If at step 164C3 the next mapping mode does not match the current mode and the next mapping mode is not the full mapping mode (step 164C6), the computer maps the (ACTION, TIMESET) vectors onto an appropriate output MAP_BYTE (step 164C7). Then it sets CURRENT_MODE equal to NEXT_MODE (step 164C8) and generates an output MAP_INST byte (step 164C9) indicating the new mapping mode. Program flow then moves to step 164C5 where the computer produces the MAP_BYTE byte as the next output sequence byte. If at step 164C6, the NEXT_MODE is the full mapping mode, then the computer sets CURRENT_MODE equal to NEXT_MODE (step 164C10), outputs a full map MAP_INST instruction (step 164C11), and maps the next input byte onto an appropriate output MAP_BYTE (step 164C12). If there are more unmapped (ACTION, TIMESET) vectors in the input sequence (step 164C5) then the host computer returns to step 164C2. Otherwise the routine ends at step 164C13.

Figure 10J:
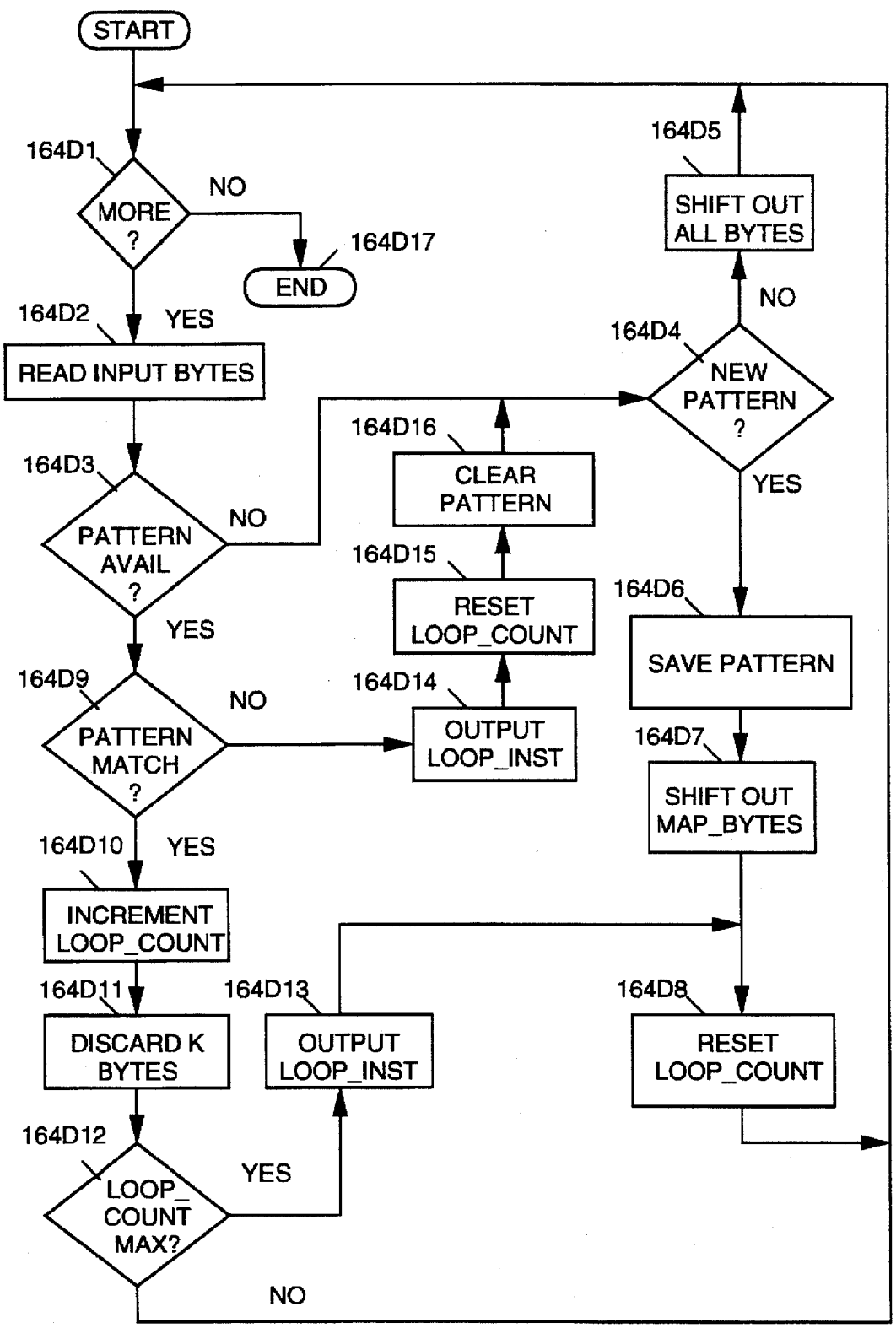
FIG. 10J is a flow chart illustrating the loop compression step of FIG. 10A.

FIG. 10J is a flow chart illustrating the loop compression step 164D of FIG. 10A. This routine compresses successive MAP_BYTE words of the sequence output of step 164D into loop instructions (LOOP_INST). Starting at step 164D1, the computer determines if there are more bytes in the input sequence to be processed. If so than it reads in a large number of bytes of the input sequence (step 164D2) into a "FIFO buffer" it has established in memory. If a loop compression pattern has not been previously established (step 164D3) then the computer reviews the bytes last read in to determine the largest repetitive pattern of up to 32 bytes it can find, if any (step 164D4). If no pattern is found, the computer shifts all of the bytes out of the FIFO buffer and provides them as output bytes (step 164D5) without providing any loop compression and returns to step 164D1 to get more bytes of the input sequence. If at step 164D4 the computer finds a repetitive pattern spanning K bytes, it saves a description of the pattern (step 164D6), shifts MAP_BYTEs out of the FIFO buffer such that the last K bytes shifted out are the first K bits that match the pattern (step 164D7). The shifted out bytes are supplied as MAP_BYTE output bytes. The computer then sets a LOOP_COUNT parameter equal to 1 (step 164D8) and returns to step 164D1. Thereafter (step 164D2), it shifts another K MAP_BYTEs into the FIFO buffer and checks if a previously stored pattern is available (step 164D3). If so, the computer checks to see if the first K bytes in the FIFO buffer match the stored pattern (step 164D9). If so, the computer increments the LOOP_COUNT parameter (step 164D10) and compresses the stored sequence (step 164D11) by shifting out and discarding the first K MAP_BYTEs in the FIFO buffer. If at step 164D12, LOOP_COUNT has not reached its maximum value (32,129) the computer returns to step 164D1 to read K more bytes into the FIFO buffer. If at step 164D12, LOOP_COUNT has reached its maximum, the computer outputs a LOOP_INST instruction (step 164D13) indicating the pattern length (1 to 32) and the LOOP_COUNT (up to 32,129). Then LOOP_COUNT is reset to 1 at step 164D8 and program flow returns to step 164D1. If at step 164D9 no pattern match is found, then the computer outputs a LOOP_INST instruction indicating the current pattern length and LOOP_COUNT (step 164D14), resets LOOP_COUNT to 0 (step 164D15), discards the saved pattern (step 164D16) and then looks for a new pattern (step 164D4). The process continues until at step 164D1 all input bytes have been processed. At that point the routine ends (step 164D17).

Figure 10K:
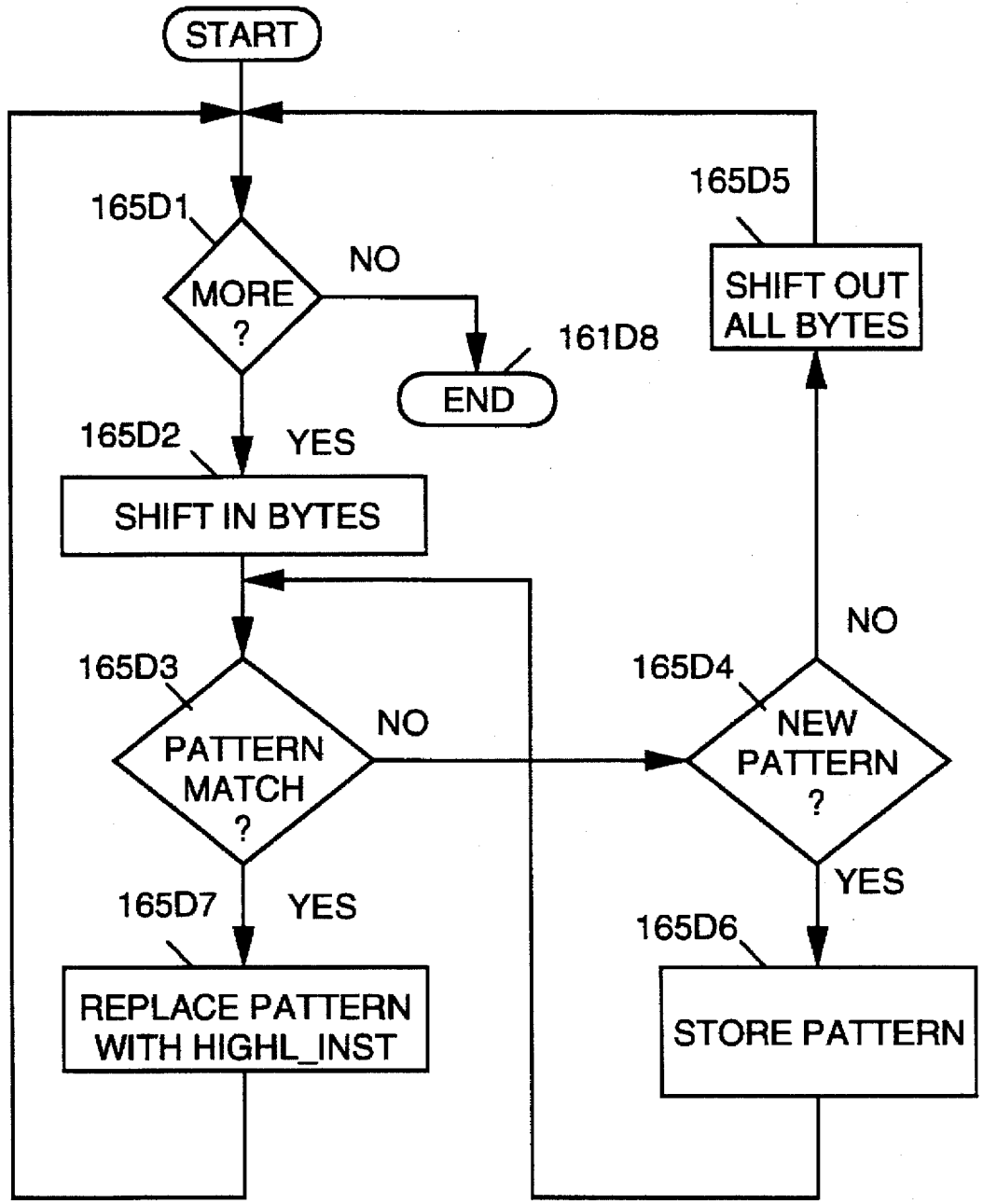
FIG. 10K is a flow chart illustrating the high level compression step of FIG. 10A.

FIG. 10K is a flow chart illustrating the high level compression step 164E of FIG. 10A. Starting at step 165D1, the computer determines if there are any more input sequence bytes to be processed. IF so, then shifts a large block of bytes (step 165D2) into memory and determines if any portion of the bytes matches any previously identified patterns (step 165D3). If not, then at step 165D4 it checks the stored sequence to see if it can determine any new repetitive patterns. If not it shifts out all bytes in memory as next bytes of its output sequence (step 165D5 and obtains more input bytes (steps 165D1, 165D2). When a new pattern is found (step 165D4) it shifts the pattern out to a portion of the node memory (step 165D6), and keeps track of the memory location of the pattern. The last byte of the stored pattern is a "return" high level instruction indicating the end of the pattern. Program flow then returns to step 165D3 where the program compares the patterns in the node memory to the bytes in the FIFO memory. When bytes stored in the FIFO memory match a stored pattern, then at step 165D7, the matching bytes are replaced with a high level instruction indicating a call to the first node memory location of the stored pattern. Program flow then returns to step 165D1. The routine is repeated until all input bytes have been processed. At that point step 165D1 directs program flow to step 161D17 where the routine ends.

NETWORK INTERFACE CIRCUITS

Figure 11:
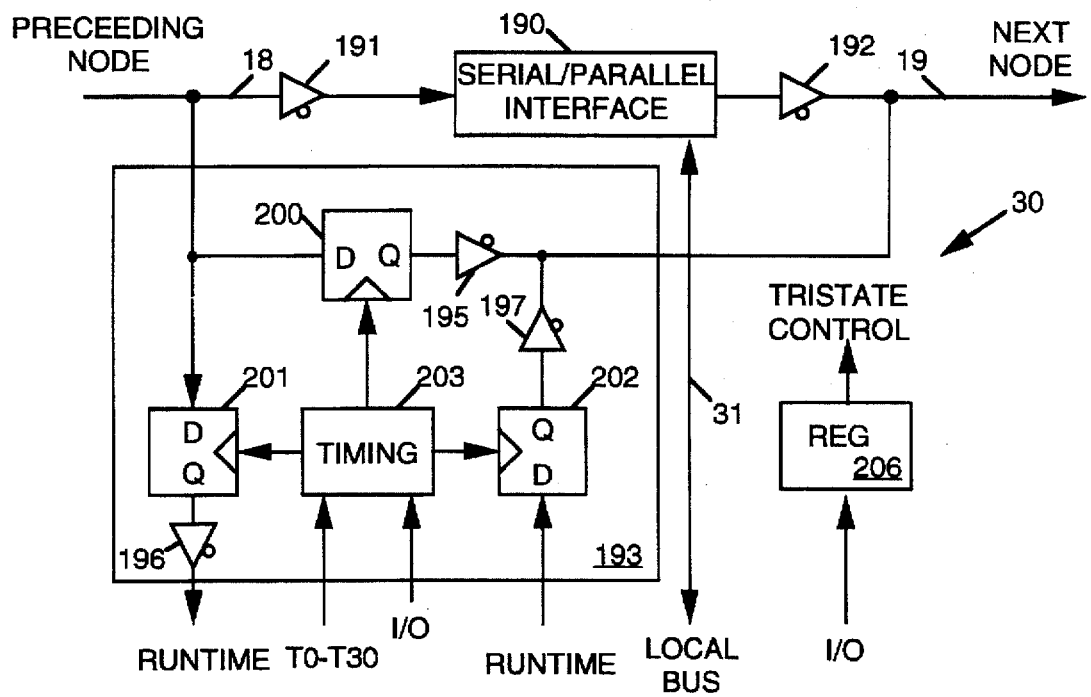
FIG. 11 is a block diagram illustrating the network interface of FIG. 2.

FIG. 11 is a block diagram illustrating one network interface 30 of a set of four network interface 30 of FIG. 2. Each network interface 30 receives data on a separate serial input transmission line 18 from a preceding network node and transmits data on a serial output transmission line 19 to the next network node with a well defined transmission time. This allows for very high uni-directional bandwidth which is not possible with standard buses. A tristate buffer 191 can selectively couple the incoming transmission line 18 to a serial/parallel interface circuit 190. Another tristate buffer 192 can selectively couple the serial/parallel interface circuit 190 to the outgoing transmission line 19. Interface circuit 190, suitably an IEEE standard 1596–1993 scalable coherent interface, receives data from transmission line 18 in serial form and forwards it onto outgoing transmission line 19 in serial form and forwards it onto local bus 31 parallel form. Serial/parallel interface circuit 190 can also transmit parallel data received on bus 31 outward in serial form on transmission line 19.

A synchronizing circuit 193 provides precise timing for transmission and receipt of RUNTIME signals conveyed on the incoming transmission line 18 and outgoing transmission line 19. Synchronizing circuit 193 comprises three tristate buffers 195–197, three type D flip-flops 200–201, and a timing circuit 203. Ringlet 18 is tied to D input of flip-flops 200 and 201 and buffer 195 couples the Q output of flip-flop 200 to outgoing transmission line 19. Buffer 196 conveys a RUNTIME signal to the instruction processing unit 36 from the Q output of flip-flop 201. A RUNTIME signal produced by the instruction processing unit 36 of FIG. 2 drives the D input of flip-flop 202. Buffer 197 couples the RUNTIME signal at the Q output of flip-flop 202 onto outgoing transmission line 19. The timing circuit 203 controls the clock inputs of flip-flops 200–202 in response to control input from the I/O controller 44 of FIG. 2 using the timing signals T0–T30 for reference. A register 206 stores a data word from the I/O controller 44 of FIG. 2, each bit of the stored data word controls enabling of tristate buffers 190–197.

When transmission lines 18 and 19 are used for conveying instructions or control data from node to node, buffers 191 and 192 are enabled thereby placing interface circuit 190 between the transmission lines. In this configuration, a host computer can access the local bus 31 of every node via the serial parallel interface 190. With access to bus 31, the host computer can write instruction into memory 34 of FIG. 2 via memory management unit 32, can write control data into the various devices 36, 38 and 40 of FIG. 2 via the I/O controller 44 of FIG. 2 and can read acquired test data out of the acquisition memory within the DUT interface circuit 40 of FIG. 2 via I/O controller 44.

During a test operation, transmission lines 18 and 19 can be used to convey RUNTIME signals into and away from the node. In such mode, buffer 195 is enabled and timing circuit 203 periodically clocks flip-flop 200 thereby latching a RUNTIME signal appearing on transmission line 18 onto transmission line 19. When the node is supposed to respond to a RUNTIME signal on transmission line 18, buffer 196 is also enabled and timing circuit 203 periodically clocks flip-flop 201 so that flip-flop 201 forwards the RUNTIME signal appearing on transmission line 18 on to processing unit 36 of FIG. 2. When the node is supposed to generate a RUNTIME signal during a test operation, buffer 197 is enabled. Timing circuit 203 periodically clocks flip-flop 202 causing flip-flop 202 to periodically latch its RUNTIME signal input onto transmission line 19.

Figure 12:
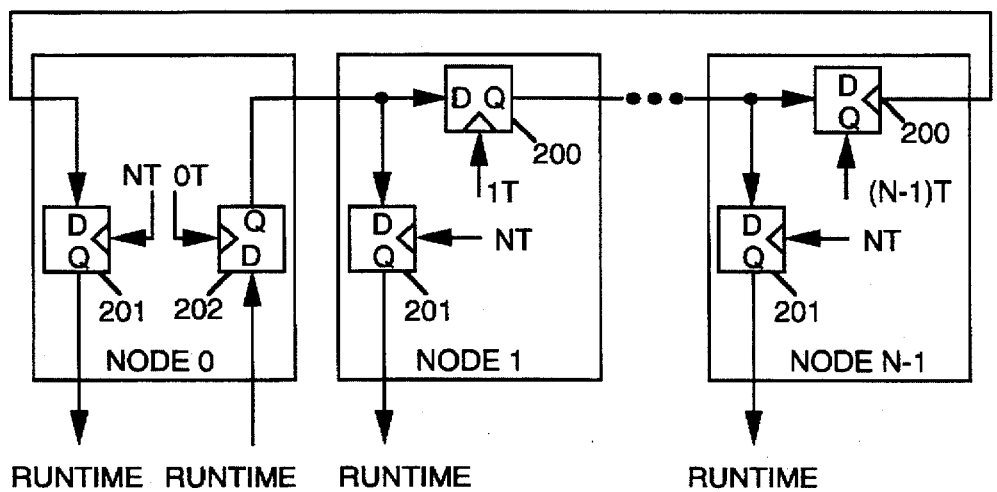
FIG. 12 is a block diagram illustrating selected portions of a set of interconnected network interface of FIG. 11.

FIG. 12 is a block diagram illustrating of how RUNTIME signals pass from node to node though a network interface. FIG. 12 shows relevant portions of each network interface 30 of a network consisting of N nodes labeled node 0 through node N-1 connected in a loop with the outgoing transmission line 19 of each node connected to the incoming transmission line 18 of the next. In the example, the processor of node 0 generates a RUNTIME signal that passes around the network loop to the network interface in each node and from the network interface to the instruction processing unit within each node. In the example of FIG. 12, the buffers 191, 192 and 195–197 of FIG. 11 are not shown, but it is assumed that buffers 191 and 192 of all nodes are disabled, buffer 196 of all nodes is enabled, buffer 195 is disabled in node 0 only, and buffer 197 is enabled in node 0 only.

To provide for synchronous response to a RUNTIME signal by all nodes, pulses of the RUNTIME signal should be delivered to all microprocessors within all nodes at the same time. Obviously a RUNTIME pulse originating at node 0 will not arrive at all nodes at the same time. However a RUNTIME pulse originating at node 0 is sequentially latched onto the D input of flip-flop 200 of each successive node of the loop and thereafter concurrently clocked through all flip-flops 201 so that the signal is sent to each node's microprocessor at the same time.

Figure 13:
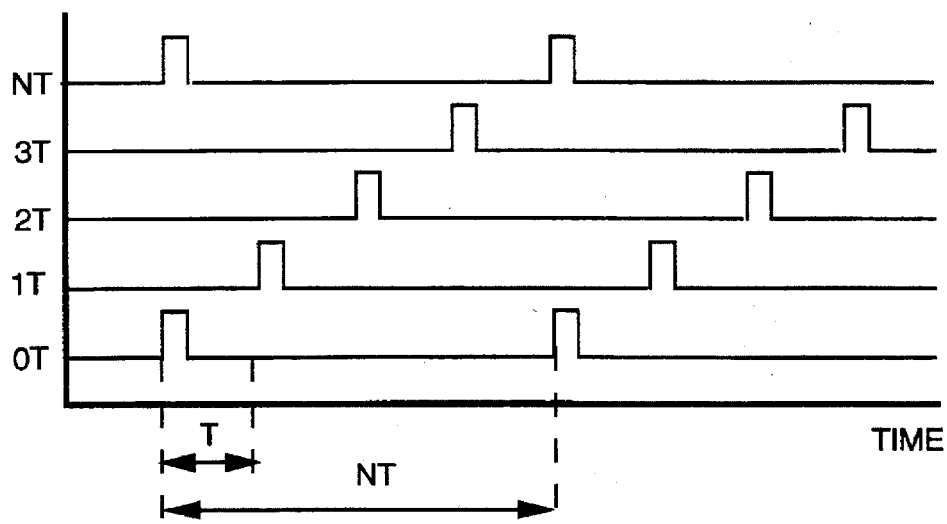
FIG. 13 is a diagram illustrating relative timing of signals in FIG. 12.

FIG. 13 illustrates flip-flop timing for FIG. 2 given the number of nodes N is equal to 4. All of the timing signals 0T, 1T ... NT have the same period N*T, where T is a unit delay period and is suitably greater than or equal to the maximum possible signal propagation delay through the slowest node of the network. Signal 0T, which clocks flip-flop 202 of node 0, and signals NT, which clock flip-flops 201 of all nodes, are in phase with one another. However all other signals 1T-NT are phase shifted one from another by T picoseconds.

When node 0 asserts the RUNTIME signal, flip-flop 202 of node 0 does nothing until the 0T signal clocks it a time 0. At that point the RUNTIME signal state passes to the Q output of flip-flop 202 of node 0 and appears at the D inputs of flip-flops 200 and 201 of node 2. T picoseconds later, flip-flop 200 of node 1 is clocked, thereby passing the RUNTIME signal to flip-flops 200 and 201 of node 2. A time 2*T, flip-flop 200 of node 2 is clocked, thereby passing the RUNTIME signal to flip-flops 200 and 201 of node 3. This process continues until at time (N-1)*T flip-flop 200 of node N is clocked thereby passing the RUNTIME signal to flip-flop 201 of node 0. At that point, the same RUNTIME signal state appears at the D inputs to all latches 201. Finally at time N*T signals NT concurrently clock flip-flops 201 of all nodes so that they simultaneously transmit the RUNTIME signal to their instruction processing units.

Figure 14:
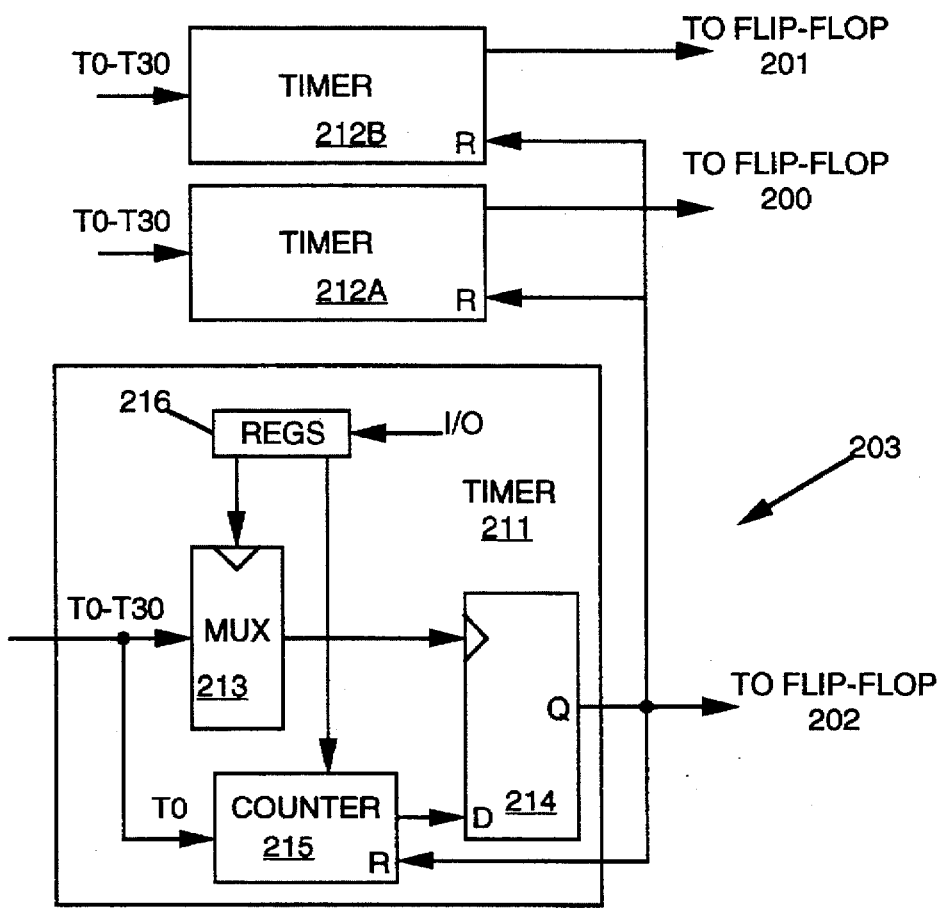
FIG. 14 is a block diagram illustrating the timing circuit of FIG. 11.

FIG. 14 is a block diagram illustrating timing circuit 203 of FIG. 11 which provides the flip-flop clocking signals to flip-flops 200–202. Timing circuit 203 includes a timer 211 produces a timing signal clocking flip-flops 202 of FIG. 11 and timers 212A and 212B producing timing signals clocking flip-flops 200 and 201 of FIG. 11. Timer 211 includes a set of registers 216 containing control data transmitted thereto from the host computer via the I/O controller 44 of FIG. 2 before the start of a test operation. A multiplexer 213 under control of data in registers 216 selects one signal from among reference timing signals T0–T30 produced by oscillator 42 of FIG. 2 and forwards it to a clock input of a type D flip-flop 214. A counter 215 counts T0 signal pulses and provides an output signal pulse to the D input of flip-flop 214 whenever the count reaches a limit indicated by data in registers 216. The Q output of flip-flop 214, which resets the count of counter 215, provides the timing signal that clocks flip-flop 202 of FIG. 11. The data in registers 216 is set so that the timing signal at the Q output of flip-flop 214 has period N*T.

Timers 212A and 212B are similar to timer 211 except that their internal counters are reset by the output of timer 211, rather than their own outputs. Since their internal counters are reset by the NT signal, their output signals each also have a period of N*T. However by adjusting the control data in timers 212A and 212B, their output signals can be phase shifted from the NT signal by any desired amount.

Each node in the preferred embodiment of the tester includes four network interfaces similar to the one network interface 30 illustrated in FIG. 11. Each network interface of a node has a separate incoming transmission line 18 and a separate outgoing transmission line 19. All four network interfaces can couple their incoming and/or outgoing transmission lines to local bus 31, though not concurrently. The four network interfaces in each node are connected to corresponding network interfaces of their two neighboring nodes to form four independent loop networks. These four independent networks allow the tester to be configured in a variety of ways as illustrated herein below.

The host computer interface 20 of FIG. 1 is substantially similar in construction and operation to the network interfaces 30 of FIG. 2 included in each node.

TESTER CONFIGURATION OPTIONS

Figure 15:
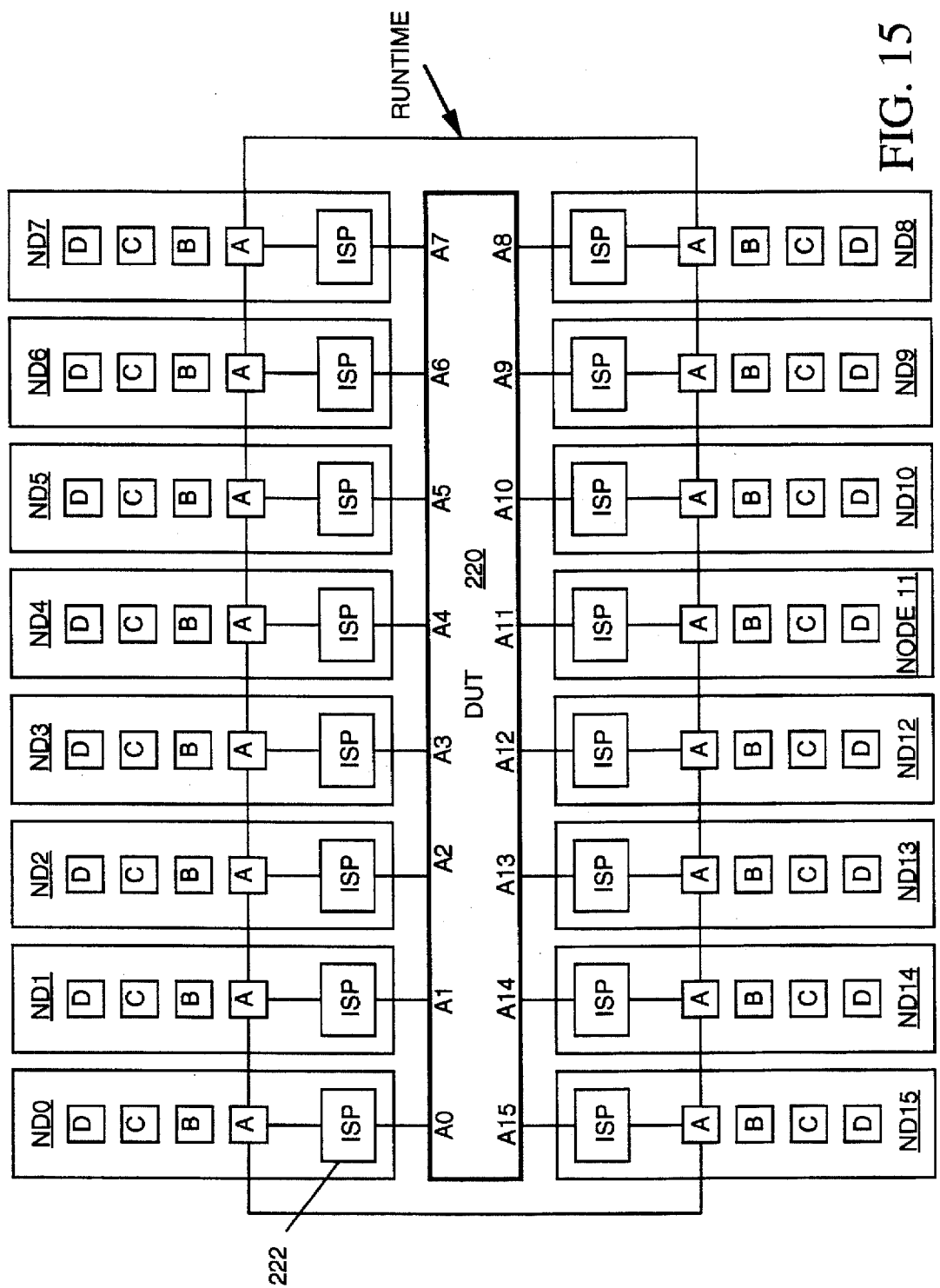
FIGS. 15–17 are block diagrams illustrating various operating configurations for the integrated circuit tester of FIG. 1.

FIG. 15 is a block diagram illustrating a "one node per pin" operating configuration for the integrated circuit tester 10 of FIG. 1 in which the tester performs a test on a single sixteen pin DUT 220. The DUT pins are labeled A0 through A15. The tester as shown in FIG. 15 has only 16 nodes ND0 through ND15, though a tester may have a much larger number of nodes and may have more nodes than pins on the DUT. As illustrated in FIG. 15, each node ND0–ND15 includes four network interfaces (A–D) along with the instruction storage and processing (ISP) portions 222 of the node 14, including everything shown in FIG. 2 except the network interface 30. Each node ND0–ND15 is connected to a corresponding pin A0–A15 of the DUT 220 for transmitting test signals thereto and/or receiving output signals therefrom. The host processor is not shown.

In this configuration, the instruction memory in each node stores all of the instructions needed to define the test signal and data acquisition operations for the DUT pin to which the node is connected. The only communication between nodes 14 during a test is via a RUNTIME signal. In the example of FIG. 15, network interfaces A of the 16 nodes are coupled in a manner similar to that shown in FIG. 12 and convey the RUNTIME signal from node to node during the test operation. The remaining network interfaces B–D are inactive because their tristate buffers 191–197 (FIG. 11) are not enabled. If more than one RUNTIME signal were needed during a test, one or more other network interfaces B–D could be activated by turning on the appropriate buffers 195–197 (FIG. 11).

Figure 16:
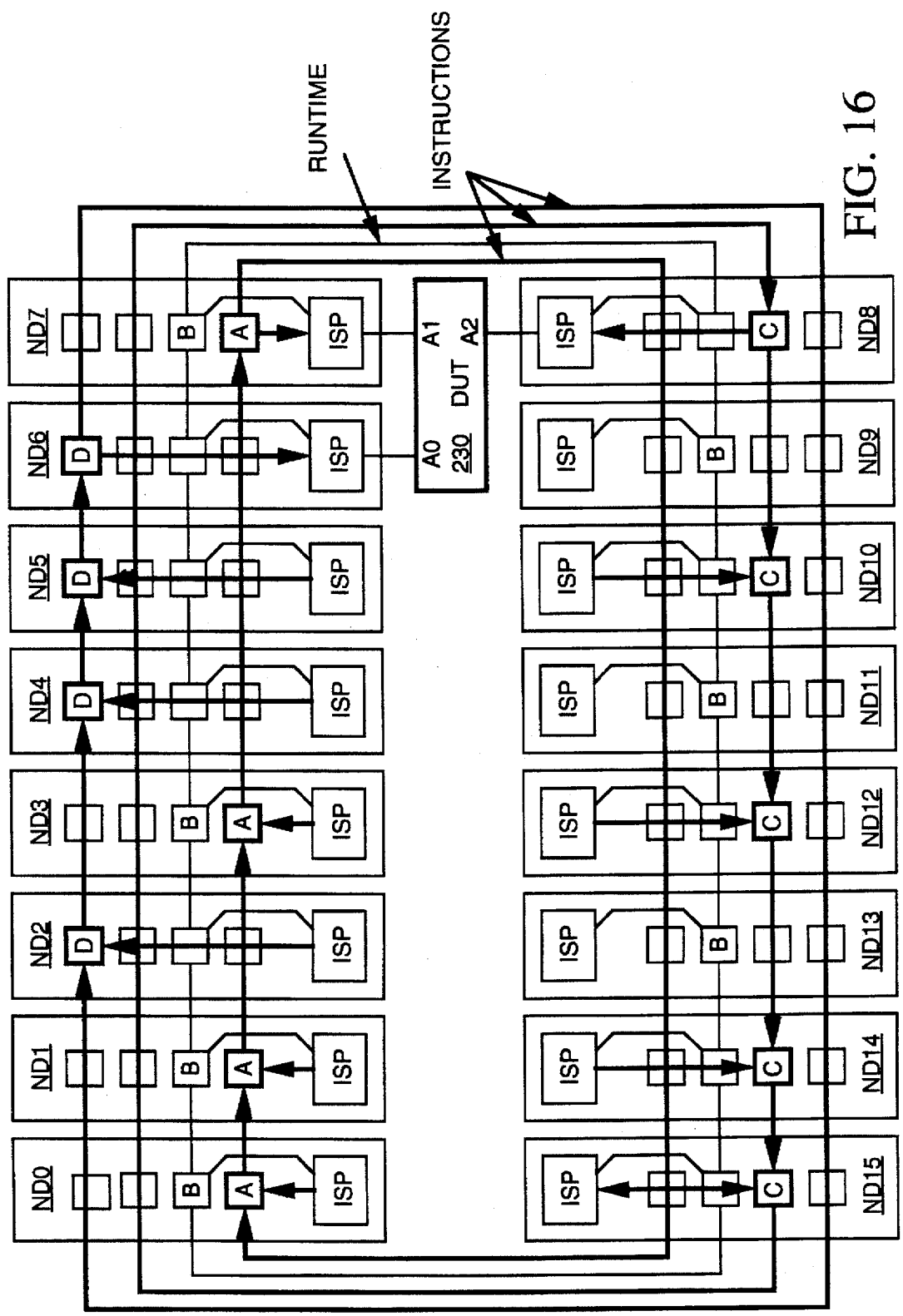

FIG. 16 is a block diagram illustrating a "multiple node per pin" operating configuration for the integrated circuit tester of FIG. 1. In this configuration the tester performs a test on a DUT 230 in which the instruction storage requirements for one or more pins exceeds the capacity of the local instruction memory. In such case the system makes use of available instruction memory capacity in other nodes. In the simplified example of FIG. 16, DUT 230 has only three pins A0 through A2 accessed by nodes ND6, ND7 and ND8, respectively. The remaining nodes are not connected to DUT pins. During a test operation, the A, C and D network interfaces of all nodes are interconnected for node to node serial data transmission. With reference to FIG. 11, the network interfaces A buffers 191 and 192 are enabled and buffers 195–197 are disabled. During the test, the ISP circuit of node 7 reads instructions not only out of its own local instruction memory but also out of the instruction memories of nodes ND0, ND1 and ND3 via the A network interface. Similarly node ND8 may acquire instructions from nodes ND10, ND12 and ND14 via the C network interface and node ND6 can acquire instructions from nodes ND2, ND4 and ND5 via the D network interfaces. In the meantime, the B network interfaces of all the nodes may be interconnected as in FIG. 12 to provide a RUNTIME signal path.

One of the other nodes not connected to a DUT pin and not storing instructions for another node, for example node ND15, may function as a "host computer" That is the instructions stored in its memory may tell its instruction processor when to transmit a RUNTIME signal to the other nodes via the B network interfaces telling them to start a test. Node ND15 may also store interrupt routines telling it how to respond to RUNTIME signals from other nodes which may, for example, signal errors or end of test. An incoming RUNTIME signal could tell node ND15 to read acquired test data out of an acquisition memory in one of the other nodes via, for example, network interface A and perform some action based on the value of the data. One such action could be to send an address to one or more other nodes via network interface A indicating the local memory location of a set of instructions to perform. This gives the tester the ability to automatically change the course of a test in response to values of acquired test data.

Figure 17:
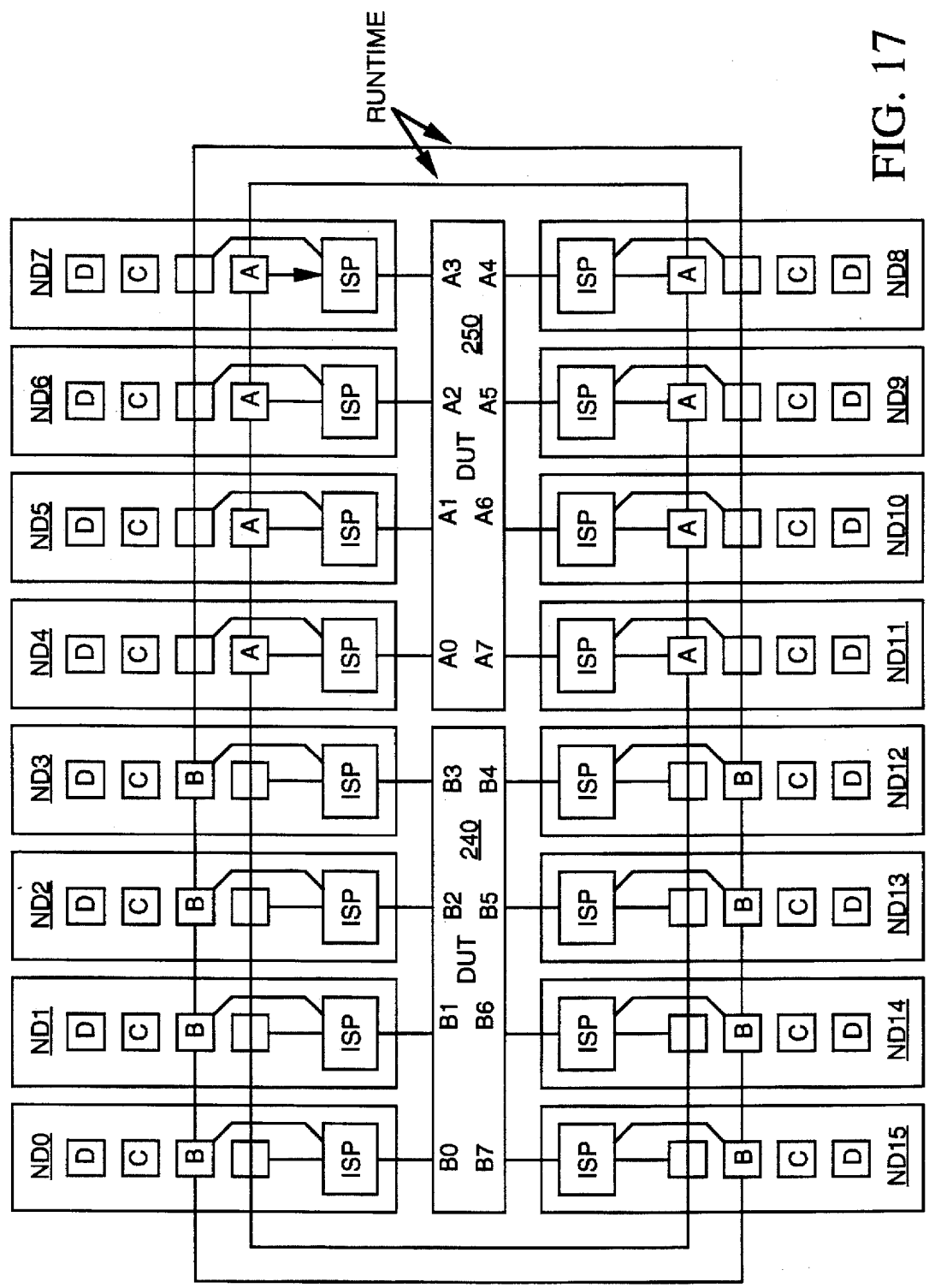

FIG. 17 is a block diagram illustrating a "multiple DUT" operating configuration for the integrated circuit tester of FIG. 1. In this configuration the tester can perform independent tests on more than one DUT. In the example of FIG. 17, two 8 pin DUT's 240 and 250 are being tested. Nodes ND0–ND3 and ND12–ND15 test pins B0–B7 of DUT 240 while nodes ND4–ND7 and 8–11 test pins A0–A7 of DUT 250. The A network interfaces of all nodes are interconnected in the manner illustrated in FIG. 12 to provide a RUNTIME signal path for the test of DUT 250 while the B network interfaces of all nodes are similarly interconnected to provide a RUNTIME signal path for the DUT 240 test. The two tests may be conducted in a completely independent manner with no RUNTIME signal coordination between the two tests. In this configuration the tester operates as two independent testers.

Thus it will be appreciated by those skilled in the art, that the multiple links 30 permit the tester to operate in a variety of useful configurations including those illustrated in FIGS. 15–17 as well as numerous combinations and permutations thereof.

Thus has been described and illustrated an integrated circuit tester for transmitting test signals to selected terminals of a device under test and acquiring data produced by the DUT at others of its terminals during a succession of test cycles. The tester includes several processing nodes, one node associated with each terminal of the DUT and each node includes a memory for storing algorithmic instructions for generating a sequence of test vectors. Each test vector includes action data indicating a particular action to be taken during a next test cycle and timing data indicating a time during the next test cycle when the action is to be taken. Each node also includes a circuits for processing the algorithmic instructions to produce the test vectors and circuits responsive to the test vectors for controlling the test signal and data acquisition as indicated by the test vectors. The integrated circuit tester can perform a long integrated circuit test without need for large node memories and without having to periodically halt the test to reload the node memories. The tester can also permit highly flexible and accurate timing of testing events during each cycle of a test. Since interconnection is node-to-node, signal transmission rate can be maximized, transmission lines can be optimized and node expansion is not limited by the laws of physics.

While the foregoing specification has described preferred embodiment(s) of the present invention, one skilled in the art may make many modifications to the preferred embodiment without departing form the invention in its broader aspects. The appended claims therefore are intended to cover all such modifications as fall within the true scope and spirit of the invention.

I claim:

1. An apparatus for performing a test of an integrated circuit (IC) including carrying out actions during successive test cycles, of equal duration, with each test cycle spanning a plurality of time slots, the test being described by input data indicating actions to be taken at terminals of said IC and indicating a time relative to a start of said test that each action is to be taken, the apparatus comprising:

a plurality of nodes;

host processing means for receiving the input data and converting the input data to a separate set of instructions for each of said nodes, each set of instructions comprising an algorithm for generating a sequence of test vectors, each test vector indicating an action to be carried out on the IC terminal during a corresponding one of said test cycles and indicating a time slot during the test cycle in which the action is to commence; and data transmission means for conveying said instructions from said processing means to said nodes before a start of said test, wherein each node comprises:

interface means contacting a terminal of said IC for carrying out a sequence of actions at said terminal in response to an input sequence of test vectors during successive cycles of said test at time slots indicated by said vectors;

memory means for receiving and storing said set of instructions conveyed to the node from said host processing means, and node processing means for reading said instructions out of said memory means during said test, executing said instructions to generate said sequence of test vectors, and supplying a separate test vector of said sequence as input to said interface means during each test cycle.

2. The apparatus in accordance with claim 1 wherein the instructions stored in each node comprises map bytes and loop instructions, wherein each node processes map bytes to produce test vectors described by the map bytes and wherein said loop instructions indicate a number of times the node is to process a set of said map bytes to produce the test vectors.

3. The apparatus in accordance with claim 1 wherein said host processing means converts the input data into separate instructions for each node by first converting the input data into a separate test vector sequence for each node and then converting each test vector sequence into the instructions for the node, the instructions indicating how the node is to produce the test vector sequence.

4. The apparatus in accordance with claim 3 wherein the host processing means converts each test vector sequence into instructions segmenting the test vector sequence into groups and replacing the groups with instructions for generating the test vector groups.

5. The apparatus in accordance with claim 1 wherein the instructions stored in each node comprises map bytes, mapping instructions, and loop instructions, wherein the nodes process the map bytes to produce test vectors described by the map bytes, wherein said mapping instructions indicate a manner in which the nodes are to process said map bytes, and wherein said loop instructions indicate a number of times the node is to process a set of said map bytes to produce the test vectors.

6. The apparatus in accordance with claim 5 wherein said node processing means comprises:

means for reading map bytes, map instructions and loop instructions out of said memory means;

storage means for receiving and storing a last N of the read out map bytes, where N is a number greater than 1;

control means receiving the read out loop and mapping instructions and generating first control signals in response to each loop instruction and generating second control signals in response to each mapping instruction;

selection means receiving each read out map byte and receiving each of the N map bytes stored in said storage means for selecting as an output map byte one of either a last received input map byte or a selected one of the N map bytes stored by said storage means in response to said first set of control signals produced by said control means; and mapping means for receiving each output map byte provided by said selection means and for processing each output map byte in response to said second control signals thereby to generate said sequence of test vectors.

7. An apparatus for performing a test on an integrated circuit (IC) spanning a succession of test cycles, the IC having a plurality of terminals, the test being described by input data indicating actions to be carried out at each terminal and times following a start of said test that the actions are to be carried out, wherein the actions include transmitting a test signal to various IC terminals and sampling an output signal produced by the IC at various IC terminals, the apparatus comprising:

host processing means for converting said input data into a plurality of test vector sequences, each test vector sequence corresponding to a separate IC terminal, successive test vectors of each sequence indicating actions to be carried out at the corresponding terminal during successive ones of said test cycles and for converting each test vector sequence into a set of instructions for generating the test vector sequence;

memory means for storing each set of instructions;

node processing means for concurrently executing the stored instructions sets thereby to concurrently generate said test vector sequences; and signal processing means for carrying out actions indicated by the concurrently generated test vectors; wherein said instructions include map bytes, mapping instructions, and loop instructions, wherein the map bytes describe test vectors, wherein said mapping instructions indicate formats by which said map bytes describe test vectors, and wherein loop instructions indicates a number of times said node processing means is to process groups of said map bytes, and wherein said node processing means generates said test vector sequences by processing said map bytes a number of times indicated by said loop instruction in accordance with formats indicated by said mapping instructions.

8. An apparatus for decompressing an instruction sequence including map bytes, mapping instructions, and loop instructions wherein each mapping instruction indicates a manner in which the apparatus is to process map bytes, wherein each loop instruction indicates a number of times a node is to process a set of said map bytes, and wherein the node processing means processes said map bytes in accordance with said mapping instructions and said loop instructions to generate an output sequence of vectors, the apparatus comprising:

storage means for sequentially receiving each map byte included in said instruction sequence and storing a last N of the map bytes of said instruction sequence where N is a number greater than 1;

control means for sequentially receiving the loop and mapping instructions included in said instruction sequence, for generating first control signals in response to each loop instruction, and for generating second control signals in response to each mapping instruction;

selection means sequentially receiving each map byte included in said instruction sequence and for receiving each of the N map bytes stored by said storage means for selecting as an output map byte one of either a last received input map byte or a selected one of the N map bytes stored by said storage means in response to said first set of control signals produced by said control means; and mapping means for receiving each output map byte provided by said selection means and for processing each output map byte in response to said second control signals thereby to generate said output sequence of vectors.

9. A method for performing a test on an integrated circuit (IC) spanning a succession of test cycles of equal duration, the IC having a plurality of terminals, the test being described by input data indicating actions to be carried out at each terminal and times following a start of said test that the actions are to be carried out, wherein the actions include transmitting a test signal to various IC terminals and sampling an output signal produced by the IC at various IC terminals, the method comprising the steps of:

converting said input data into a plurality of test vector sequences, each test vector sequence corresponding to a separate IC terminal, each successive test vector of each sequence indicating an action to be carried out at the corresponding terminal during a corresponding one of said test cycles and indicating a particular time during the test cycle at which the action is to commence;

converting each test vector sequence into a set of instructions for generating the test vector sequence;

concurrently executing the instructions sets thereby to concurrently generate said test vector sequences; and carrying out actions at the IC nodes at times indicated by the concurrently generated test vectors.

10. The method in accordance with claim 9 wherein the step of converting each test vector sequence into a set of instructions for generating the test vector sequence comprises the steps of segmenting the test vector sequence into groups of test vectors, and replacing the groups with instructions for generating the groups.

* * * * *

UNITED STATES PATENT AND TRADEMARK OFFICE
CERTIFICATE OF CORRECTION

PATENT NO. : 5,696,772
DATED : December 9, 1997
INVENTOR(S) : Gary J. LESMEISTER It is certified that error appears in the above-identified patent and that said Letters Patent is hereby corrected as shown below:

```
    Claim 6, line 1, (Column 31, line 63), "claim 5" should
read --claim 1--.
```

Signed and Sealed this

Seventeenth Day of February, 1998

Attest:

BRUCE LEHMAN

*Attesting Officer*       *Commissioner of Patents and Trademarks*